United States Patent
Mochiki et al.

(10) Patent No.: US 8,383,001 B2
(45) Date of Patent: Feb. 26, 2013

(54) PLASMA ETCHING METHOD, PLASMA ETCHING APPARATUS AND STORAGE MEDIUM

(75) Inventors: Hiromasa Mochiki, Yamanashi (JP); Yoshinobu Ooya, Yamanashi (JP); Fumio Yamazaki, Yamanashi (JP); Toshio Haga, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 432 days.

(21) Appl. No.: 12/707,957

(22) Filed: Feb. 18, 2010

(65) Prior Publication Data

US 2010/0213162 A1  Aug. 26, 2010

Related U.S. Application Data

(60) Provisional application No. 61/224,162, filed on Jul. 9, 2009.

(30) Foreign Application Priority Data

Feb. 20, 2009 (JP) ................................. 2009-037375
Oct. 28, 2009 (JP) ................................. 2009-247725

(51) Int. Cl.
*B44C 1/22* (2006.01)

(52) U.S. Cl. ...... 216/67; 216/37; 156/345.1; 204/192.1; 204/298.01; 438/723; 438/724; 438/725

(58) Field of Classification Search .................... 216/37, 216/67; 156/345.1; 438/710, 714, 723–725
See application file for complete search history.

(56) References Cited

U.S. PATENT DOCUMENTS

| 4,595,452 A * | 6/1986 | Landau et al. ............... 438/713 |
| 5,716,534 A * | 2/1998 | Tsuchiya et al. ................ 216/67 |
| 7,547,636 B2 * | 6/2009 | Chi et al. ....................... 438/714 |
| 2007/0221493 A1 * | 9/2007 | Honda et al. ............... 204/192.1 |

FOREIGN PATENT DOCUMENTS

| JP | 2000-173993 A | 6/2000 |
| JP | 2006-270019 A | 10/2006 |

* cited by examiner

*Primary Examiner* — Lan Vinh
*Assistant Examiner* — Maki Angadi
(74) *Attorney, Agent, or Firm* — Pearne & Gordon LLP

(57) ABSTRACT

There is provided a plasma etching method capable of achieving a sufficient organic film modifying effect by high-velocity electrons. In forming a hole in an etching target film by plasma etching, a first condition of generating plasma within a processing chamber by way of turning on a plasma-generating high frequency power application unit and a second condition of not generating the plasma within the processing chamber by way of turning off the plasma-generating high frequency power application unit are repeated alternately. Further, a negative DC voltage is applied from a first DC power supply such that an absolute value of the applied negative DC voltage during a period of the second condition is greater than an absolute value of the applied negative DC voltage during a period of the first condition.

16 Claims, 20 Drawing Sheets

PLASMA ETCHING METHOD, PLASMA ETCHING APPARATUS AND STORAGE MEDIUM

CROSS-REFERENCE TO RELATED APPLICATION

This application claims the benefit of Japanese Patent Application No. 2009-037375 filed on Feb. 20, 2009, Japanese Patent Application No. 2009-247725 filed on Oct. 28, 2009 and U.S. Provisional Application Ser. No. 61/224,162 filed on Jul. 9, 2009, the entire disclosures of which are incorporated herein by reference.

FIELD OF THE INVENTION

The present disclosure relates to a plasma etching method for performing plasma etching on a processing target substrate such as a semiconductor substrate and also relates to a plasma etching apparatus and a storage medium.

BACKGROUND OF THE INVENTION

For example, in a semiconductor device manufacturing process, there has often been used a plasma etching process, in which a predetermined layer formed on a target substrate such as a semiconductor wafer is etched by plasma, using a resist as a mask in order to form a predetermined pattern on the layer.

Although various kinds of plasma etching apparatuses have been used to perform such a plasma etching process, a plasma etching apparatus of a capacitively coupled parallel plate type has been mainly used.

The capacitively coupled parallel plate type plasma etching apparatus includes a chamber with a pair of parallel plate electrodes (upper and lower electrodes) provided therein. While a processing gas is introduced into the chamber, a high frequency power is applied to at least one of the electrodes to form a high frequency electric field between the electrodes. The processing gas is excited into plasma by the high frequency electric field, thereby performing a plasma etching process on a predetermined layer formed on a semiconductor wafer.

To be specific, there has been known a plasma etching apparatus for generating plasma in a desired state by applying a plasma generation high frequency power having a relatively high frequency and an ion implantation high frequency power having a relatively low frequency. With this apparatus, it is possible to perform an etching process with high selectivity and high reproducibility (for example, see Patent Document 1). In such an etching process, etching is performed by plasma, mainly including positive ions, of a processing gas.

Meanwhile, in order to meet a recent increasing demand for microprocessing, a film thickness of a photoresist used as a etching mask is getting thinner, and an ArF photoresist, which is exposed to a laser beam of which a light emitting source is an ArF gas having a shorter wavelength, has been widely employed. However, since the ArF photoresist has low plasma resistance, it has been difficult to form an etching hole with a sufficient etching selectivity.

To solve such a problem, Patent Document 2 discloses a technique of modifying an organic mask, such as an ArF photoresist, having a low etching resistance by implanting high-velocity electrons into a semiconductor wafer by means of applying a DC voltage to an upper electrode of a capacitively coupled parallel plate type plasma etching apparatus.

However, the effect of modifying the organic mask by the high-velocity electrons depends on a thickness of a plasma sheath on the semiconductor wafer. That is, a sufficient modification effect can be achieved in a process in which a high frequency bias power is low, so that the thickness of the plasma sheath is thin. However, when a high frequency bias power is high, the thickness of the plasma sheath would be increased so that the high-velocity electrons would be reflected from the plasma sheath. Accordingly, the high-velocity electrons may fail to reach the semiconductor wafer. As a result, a sufficient modification effect for the organic mask cannot be achieved by the high-velocity electrons.

Moreover, recently, along with the miniaturization of the semiconductor device, there has been a demand for HARC (High Aspect Ratio Contact) etching which features an aspect ratio equal to or higher than about 20. More recently, an ever higher aspect ratio beyond about 40 is demanded for next-generation HARC etching.

In such a HARC etching process, a photoresist as an etching mask is negatively charged. Thus, electric charges are neutralized on an etching surface in the early stage of the etching. As etching progresses, however, the aspect ratio increases, and, thus, the etching surface gets positively charged because positive ions are accumulated at the bottom of the hole. Therefore, positive ions, which play a key role in the etching processes, change its direction due to repulsion in the holes, resulting in warp or deformation of etching shapes. Further, as the bottom of the hole is positively charged, shading damage may be caused. Furthermore, since it becomes difficult for the positive ions to reach the bottom of the hole, an etching rate may be deteriorated.

Patent Document 1: Japanese Patent Laid-open Publication No. 2000-173993
Patent Document 2: Japanese Patent Laid-open Publication No. 2006-270019

BRIEF SUMMARY OF THE INVENTION

In view of the foregoing, the present disclosure provides a plasma etching method and a plasma etching apparatus capable of exhibiting a sufficient effect of modifying an organic film by high-velocity electrons.

Further, the present disclosure provides a plasma etching method and a plasma etching apparatus capable of forming a hole having a good etching shape and a high aspect ratio by way of etching an etching target film at a high etching rate.

Further, the present disclosure also provides a storage medium storing therein a program for executing the plasma etching methods.

In accordance with a first aspect of the present disclosure, there is provided a plasma etching method for forming a hole in an etching target film by using a plasma etching apparatus. The plasma etching apparatus includes an evacuable processing chamber configured to accommodate a processing target object therein; a lower electrode provided within the processing chamber and serving as a mounting table for the processing target object; an upper electrode provided within the processing chamber and facing the lower electrode; a processing gas supply unit configured to supply a processing gas into the processing chamber; a plasma-generating high frequency power application unit configured to apply a high frequency power for plasma generation to at least one of the upper electrode and the lower electrode; and a first DC power supply configured to apply a negative DC voltage to the upper electrode. The plasma etching method includes alternately repeating a first condition for generating plasma within the processing chamber by turning on the plasma-generating high frequency power application unit and a second condition for not generating plasma within the processing chamber by turning off the plasma-generating high frequency power application unit, and applying the negative DC voltage from the first DC power supply such that an absolute value of the applied negative DC voltage during a period of the second condition is greater than an absolute value of the applied negative DC voltage during a period of the first condition.

Desirably, in the first aspect, the plasma etching apparatus may further include a bias-applying high frequency power supply unit configured to apply a high frequency power for bias application to the lower electrode, and the bias-applying high frequency power supply unit may be turned on and off in synchronization with an on/off operation of the plasma-generating high frequency power application unit.

In accordance with a second aspect of the present disclosure, there is provided a plasma etching method for forming a hole in an etching target film by using a plasma etching apparatus. The plasma etching apparatus includes an evacuable processing chamber configured to accommodate a processing target object therein; a lower electrode provided within the processing chamber and serving as a mounting table for the processing target object; an upper electrode provided within the processing chamber and facing the lower electrode; a processing gas supply unit configured to supply a processing gas into the processing chamber; a plasma-generating high frequency power application unit configured to apply a high frequency power for plasma generation to at least one of the upper electrode and the lower electrode; and a first DC power supply configured to apply a negative DC voltage to the upper electrode. The plasma etching method includes a first process of generating plasma within the processing chamber by way of continuously supplying the high frequency power from the plasma-generating high frequency power application unit, and applying the negative DC voltage to the upper electrode from the first DC power supply when necessary; and after the first process, a second process of alternately repeating a first condition for generating plasma within the processing chamber by turning on the plasma-generating high frequency power application unit and a second condition for not generating plasma within the processing chamber by turning off the plasma-generating high frequency power application unit, and applying the negative DC voltage from the first DC power supply such that an absolute value of the applied negative DC voltage during a period of the second condition is greater than an absolute value of the applied negative DC voltage during a period of the first condition.

Desirably, in the second aspect, the plasma etching apparatus may further include a bias-applying high frequency power supply unit configured to apply a high frequency power for bias application to the lower electrode. In the first process, a bias may be continuously applied from the bias-applying high frequency power supply unit, and in the second process, the bias-applying high frequency power supply unit may be turned on and off in synchronization with an on/off operation of the plasma-generating high frequency power application unit.

In the first and second aspects, the negative DC voltage may be applied from the first DC power supply during both the period of the first condition and the period of the second condition. Further, the negative DC voltage from the first DC power supply may not be applied during the period of the first condition and the negative DC voltage from the first DC power supply may be applied during the period of the second condition.

In accordance with a third aspect of the present disclosure, there is provided a plasma etching method for forming a hole in an etching target film by using a plasma etching apparatus. The plasma etching apparatus includes an evacuable processing chamber configured to accommodate a processing target object therein; a lower electrode provided within the processing chamber and serving as a mounting table for the processing target object; an upper electrode provided within the processing chamber and facing the lower electrode; a processing gas supply unit configured to supply a processing gas into the processing chamber; a plasma-generating high frequency power application unit configured to apply a high frequency power for plasma generation to at least one of the upper electrode and the lower electrode; and a first DC power supply configured to apply a negative DC voltage to the upper electrode; and a second DC power supply configured to apply a positive DC voltage to the lower electrode. The plasma etching method includes alternately repeating a first condition for generating plasma within the processing chamber by turning on the plasma-generating high frequency power application unit and a second condition for not generating plasma within the processing chamber by turning off the plasma-generating high frequency power application unit, and applying the negative DC voltage to the upper electrode from the first DC power supply at least during the period of the second condition while applying the positive DC voltage to the lower electrode from the second DC power supply only during the period of the second condition.

Desirably, in the third aspect, the plasma etching apparatus may further include a bias-applying high frequency power supply unit configured to apply a high frequency power for bias application to the lower electrode, and the bias-applying high frequency power supply unit may be turned on and off in synchronization with an on/off operation of the plasma-generating high frequency power application unit.

In accordance with a fourth aspect of the present disclosure, there is provided a plasma etching method for forming a hole in an etching target film by using a plasma etching apparatus. The plasma etching apparatus includes an evacuable processing chamber configured to accommodate a processing target object therein; a lower electrode provided within the processing chamber and serving as a mounting table for the processing target object; an upper electrode provided within the processing chamber and facing the lower electrode; a processing gas supply unit configured to supply a processing gas into the processing chamber; a plasma-generating high frequency power application unit configured to apply a high frequency power for plasma generation to at least one of the upper electrode and the lower electrode; and a first DC power supply configured to apply a negative DC voltage to the upper electrode; and a second DC power supply configured to apply a positive DC voltage to the lower electrode. The plasma etching method includes a first process of generating plasma within the processing chamber by way of continuously supplying the high frequency power from the plasma-generating high frequency power application unit, and applying the negative DC voltage to the upper electrode from the first DC power supply when necessary; and after the first process, a second process of alternately repeating a first condition for generating plasma within the processing chamber by turning on the plasma-generating high frequency power application unit and a second condition for not generating plasma within the processing chamber by turning off the plasma-generating high frequency power application unit, and applying the negative DC voltage to the upper electrode from the first DC power supply at least during the period of the second condition while applying the positive DC voltage to the lower electrode from the second DC power supply only during the period of the second condition.

Desirably, in the fourth aspect, the plasma etching apparatus may further include a bias-applying high frequency power supply unit configured to apply a high frequency power for bias application to the lower electrode. In the first process, a bias may be continuously applied from the bias-applying high frequency power supply unit, and in the second process, the bias-applying high frequency power supply unit may be turned on and off in synchronization with an on/off operation of the plasma-generating high frequency power application unit.

Desirably, in the third and fourth aspects, the positive DC voltage may be applied to the lower electrode only one time in a pulse pattern during the period of the second condition. Desirably, in this case, the positive DC voltage may be applied in a pulse pattern in about 10 μsec to about 30 μsec after the second condition is started. Further, an absolute value of the negative DC voltage applied to the upper electrode during the period of the second condition may be desirably set to be greater than an absolute value of the negative DC voltage applied during the period of the first condition.

In the first to fourth aspects, repetition of the first condition and the second condition may be carried out by applying the high frequency power from the plasma-generating high frequency power application unit in a pulse pattern. As a typical example, the etching target film of the processing target object may be an insulating film.

In accordance with a fifth aspect of the present disclosure, there is provided a plasma etching apparatus including: an evacuable processing chamber configured to accommodate a processing target object therein; a lower electrode provided within the processing chamber and serving as a mounting table for the processing target object; an upper electrode provided within the processing chamber and facing the lower electrode; a processing gas supply unit configured to supply a processing gas into the processing chamber; a plasma-generating high frequency power application unit configured to apply a high frequency power for plasma generation to at least one of the upper electrode and the lower electrode; a first DC power supply configured to apply a negative DC voltage to the upper electrode; and a control unit configured to control the plasma-generating high frequency power application unit. The control unit performs a control to alternately repeat a first condition for generating plasma within the processing chamber by turning on the plasma-generating high frequency power application unit and a second condition for not generating plasma within the processing chamber by turning off the plasma-generating high frequency power application unit, and to apply the negative DC voltage from the first DC power supply such that an absolute value of the applied negative DC voltage during a period of the second condition is greater than an absolute value of the applied negative DC voltage during a period of the first condition.

Desirably, in the fifth aspect, the plasma etching apparatus may further include a bias-applying high frequency power supply unit configured to apply a high frequency power for bias application to the lower electrode. Desirably, the control unit may turn on and off the bias-applying high frequency power supply unit in synchronization with an on/off operation of the plasma-generating high frequency power application unit.

Further, the control unit may control the first DC power supply to apply the negative DC voltage during both the period of the first condition and the period of the second condition. Furthermore, the control unit may control the first DC power supply not to apply the negative DC voltage during the period of the first condition but to apply the negative DC voltage during the period of the second condition.

In accordance with a sixth aspect of the present disclosure, there is provided a plasma etching apparatus including: an evacuable processing chamber configured to accommodate a processing target object therein; a lower electrode provided within the processing chamber and serving as a mounting table for the processing target object; an upper electrode provided within the processing chamber and facing the lower electrode; a processing gas supply unit configured to supply a processing gas into the processing chamber; a plasma-generating high frequency power application unit configured to apply a high frequency power for plasma generation to at least one of the upper electrode and the lower electrode; a first DC power supply configured to apply a negative DC voltage to the upper electrode; a second DC power supply configured to apply a positive DC voltage to the lower electrode; and a control unit configured to control the plasma-generating high frequency power application unit. The control unit performs a control to alternately repeat a first condition for generating plasma within the processing chamber by turning on the plasma-generating high frequency power application unit and a second condition for not generating plasma within the processing chamber by turning off the plasma-generating high frequency power application unit, and to apply the negative DC voltage to the upper electrode from the first DC power supply at least during a period of the second condition while applying the positive DC voltage to the lower electrode from the second DC power supply unit only during a period of the second condition.

Desirably, in the sixth aspect, the plasma etching apparatus may further include a bias-applying high frequency power supply unit configured to apply a high frequency power for bias application to the lower electrode. Desirably, the control unit may turn on and off the bias-applying high frequency power supply unit in synchronization with an on/off operation of the plasma-generating high frequency power application unit. Further, the control unit may control the first DC power supply to apply the negative DC voltage to the upper electrode during both the period of the first condition and the period of the second condition. Furthermore, the control unit may control the second DC power supply unit to apply the positive DC voltage to the upper electrode only one time in a pulse pattern during the period of the second condition. Further, the control unit may control the first DC power supply such that an absolute value of the negative DC voltage applied to the upper electrode during the period of the second condition is greater than an absolute value of the negative DC voltage applied during the period of the first condition.

In accordance with a seventh aspect of the present disclosure, there is provided a computer-readable storage medium for storing therein a computer-executable program for controlling a plasma etching apparatus. When operated, the program controls the plasma etching apparatus on a computer to perform the plasma etching method.

In accordance with the present disclosure, the first condition of generating plasma within the processing chamber by way of turning on the plasma-generating high frequency power application unit and the second condition of not generating plasma within the processing chamber by way of turning off the plasma-generating high frequency power application unit are repeated alternately, and the negative DC voltage is applied from the first DC power supply such that an absolute value of the applied negative DC voltage during the period of the second condition is greater than an absolute value of the applied negative DC voltage during the period of the first condition. Therefore, by applying the DC voltage having a great absolute value during the second condition period when a plasma sheath is thinned due to the absence of the plasma, a greater amount of secondary electrons can be generated. As the secondary electrons modify the organic film formed on the substrate, the organic film can be reinforced. Further, although the plasma sheath is thickened especially when the high frequency power for bias application is applied to the lower electrode, the bias-applying high frequency power supply unit is turned on and off in synchronization with an on/off operation of the plasma-generating high frequency power application unit, thereby contracting the plasma sheath during the second condition period when the plasma is not generated. Thus, the secondary electrons can be supplied to the organic film effectively.

Further, during the second condition period when the plasma is not generated, a larger amount of secondary electrons are generated by the negative DC voltage having a great absolute value applied to the upper electrode from the first DC power supply. Then, the generated secondary electrons are highly accelerated and introduced into the hole without repulsion by the sheath. Likewise, negative ions generated during the absence of the plasma are also highly accelerated by the negative DC voltage having a great absolute value and introduced into the hole without repulsion by the sheath. Therefore, a great amount of secondary electrons and negative ions can be supplied into the contact hole 133 during the plasma-off period, thus neutralizing positive charges within the contact hole. Afterwards, when plasma is generated under the first condition, positive ions can travel straight without changing their directions. Accordingly, a desirable etching shape can be obtained, and shading damage can be prevented.

Furthermore, in accordance with the present disclosure, the first condition for generating plasma within the processing chamber by turning on the plasma-generating high frequency power application unit and the second condition for not generating plasma within the processing chamber by turning off the plasma-generating high frequency power application unit are repeated alternately, and the negative DC voltage is applied to the upper electrode from the first DC power supply at least during the period of the second condition while applying the positive DC voltage to the lower electrode from the second DC power supply only during the period of the second condition. Accordingly, etching is carried out by positive ions in the plasma (glow plasma) generated under the first condition, and the electrons accelerated by the negative DC voltage from the first DC power supply are supplied into the hole in the early stage of plasma (after-glow plasma) maintained for about several tens of μsec after the plasma-generating high frequency power application unit is turned off under the second condition. Further, in the middle and later stages of the after-glow plasma, negative ions can be implanted into the hole by the positive DC voltage applied from the second DC power supply. Accordingly, the electrons and the negative ions can be effectively introduced into the hole, and thus the positive charges within the hole can be certainly neutralized. Thus, when plasma is generated under the first condition, positive ions can travel straight without changing their directions. Accordingly, a desirable etching shape can be still obtained even in HARC etching having a high aspect ratio equal to or greater than about 40, and shading damage can be prevented. Further, it is also possible to suppress a decrease of an etching rate, which might be caused by an increase of the aspect ratio as the etching progresses.

Further, by applying the positive DC voltage to the lower electrode from the second DC power supply, negative ions can be still implanted into the hole during the period of the after-glow plasma, and, thus, the etching is performed.

BRIEF DESCRIPTION OF THE DRAWINGS

The disclosure may best be understood by reference to the following description taken in conjunction with the following figures.

DETAILED DESCRIPTION OF THE INVENTION

Hereinafter, embodiments of the present disclosure will be described with reference to the accompanying drawings.

First Embodiment

First, a first embodiment of the present disclosure will be described.

Figure 1:
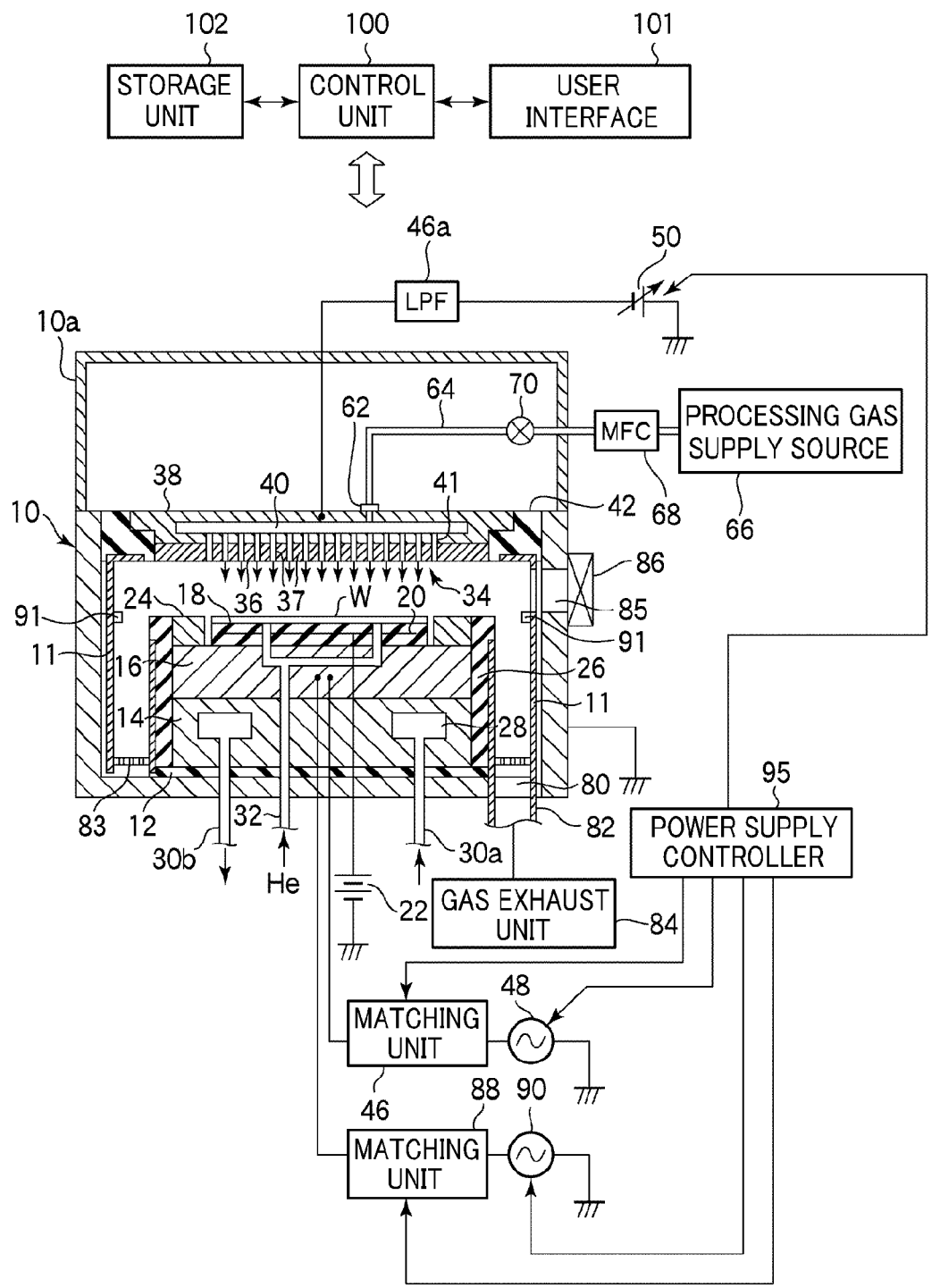
FIG. 1 is a schematic cross sectional view illustrating an example plasma etching apparatus capable of performing a plasma etching method in accordance with a first embodiment of the present disclosure.

FIG. 1 is a schematic cross sectional view illustrating an example plasma etching apparatus capable of performing a plasma etching method in accordance with a first embodiment of the present disclosure.

This plasma etching apparatus is configured as a capacitively coupled parallel plate type plasma etching apparatus and includes a substantially cylindrical chamber (processing vessel) 10 made of, e.g., aluminum with an anodically oxidized surface. The chamber 10 is frame-grounded.

A cylindrical susceptor support 14 is installed on a bottom of the chamber 10, with an insulating plate 12 made of ceramic therebetween. On the susceptor support 14, a susceptor 16 made of, e.g., aluminum is installed. The susceptor 16 serves as a lower electrode, and a semiconductor wafer W as a target substrate is mounted thereon.

On a top surface of the susceptor 16, an electrostatic chuck 18 for attracting and holding the semiconductor wafer W by an electrostatic force is installed. This electrostatic chuck 18 is configured to have an electrode 20 formed of a conductive film between a pair of insulating layers or insulating sheets and the electrode 20 is electrically connected with a DC power supply 22. The semiconductor wafer W is attracted and held on the electrostatic chuck 18 by an electrostatic force such as a Coulomb force generated by a DC voltage from the DC power supply 22.

A conductive focus ring (correction ring) 24 made of, e.g., a silicon, for improving an etching uniformity is provided on the top surface of the susceptor 16 around the electrostatic chuck 18 (semiconductor wafer W). At a side surface of the susceptor 16 and the susceptor support 14, a cylindrical inner wall member 26 made of, e.g., quartz is installed.

For example, a coolant reservoir 28 is provided within the susceptor support 14 along the circumference of the susceptor support 14. A coolant such as cooling water of a predetermined temperature is supplied and circulated from a non-illustrated chiller unit, which is installed outside the plasma etching apparatus, into the coolant reservoir 28 through coolant lines 30a and 30b. Accordingly, it is possible to control a processing temperature of the semiconductor wafer W on the susceptor 16 by the coolant.

Furthermore, a heat transfer gas such as a He gas is supplied into between a top surface of the electrostatic chuck 18 and a rear surface of the semiconductor wafer W from a non-illustrated heat transfer gas supply unit through a gas supply line 32.

Above the susceptor 16 serving as a lower electrode, an upper electrode 34 is positioned so as to face the susceptor 16 in parallel. A space between the upper and lower electrodes 34 and 16 is a plasma generation space. The upper electrode 34 has a surface (facing surface) facing the semiconductor wafer W on the susceptor 16 serving as a lower electrode, and this facing surface is in contact with the plasma generation space.

The upper electrode 34 is supported at the top of the chamber 10 by an insulating shield member 42. The upper electrode 34 includes: an electrode plate 36, which is formed as a surface facing the susceptor 16, having a plurality of gas discharge holes 37; and an electrode support 38 for detachably supporting the electrode plate 36. The electrode support 38 is made of a conductive material such as aluminum and has a water-cooling structure. The electrode plate 36 is desirably made of conductor or a semiconductor of a low resistance with low Joule's heat, and it is also desirable to be made of a silicon-containing material in order to reinforce a resist as described below. To be specific, the electrode plate 36 is desirably made of silicon or SiC. The electrode support 38 includes therein a gas diffusion space 40, and a plurality of gas through holes 41 communicated with the gas discharge holes 37 are extended downwardly from the gas diffusion space 40.

On the electrode support 38, there is provided a gas inlet 62 for introducing a processing gas into the gas diffusion space 40, and the gas inlet 62 is connected with a gas supply line 64. The gas supply line 64 is connected with a processing gas supply source 66. Further, there are provided a mass flow controller (MFC) 68 and an opening/closing valve 70 in sequence from an upstream side of the gas supply line 64 (FCS may be installed instead of MFC). A fluorocarbon gas (CxFy), such as $C_4F_8$ gas, as a processing gas for etching is supplied from the processing gas supply source 66 into the gas diffusion space 40 through the gas supply line 64 and then the fluorocarbon gas is discharged into the plasma generation space via the gas through holes 41 and the gas discharge holes 37, as in a shower device. That is, the upper electrode 34 functions as a shower head for supplying the processing gas.

The upper electrode 34 is electrically connected with a first DC power supply 50 via a low pass filter (LPF) 46a. To be more specific, a cathode of the first DC power supply 50 is connected to the side of the upper electrode 34, whereby a negative (minus) voltage is applied to the upper electrode 34. The low pass filter (LPF) 46a traps high frequency components outputted from a first and a second high frequency power supply which will be described later and may include an LR filter or an LC filter.

There is installed a cylindrical ground conductor 10a which extends upwardly from a sidewall of the chamber 10 to be higher than the height of the upper electrode 34.

Figure 2:
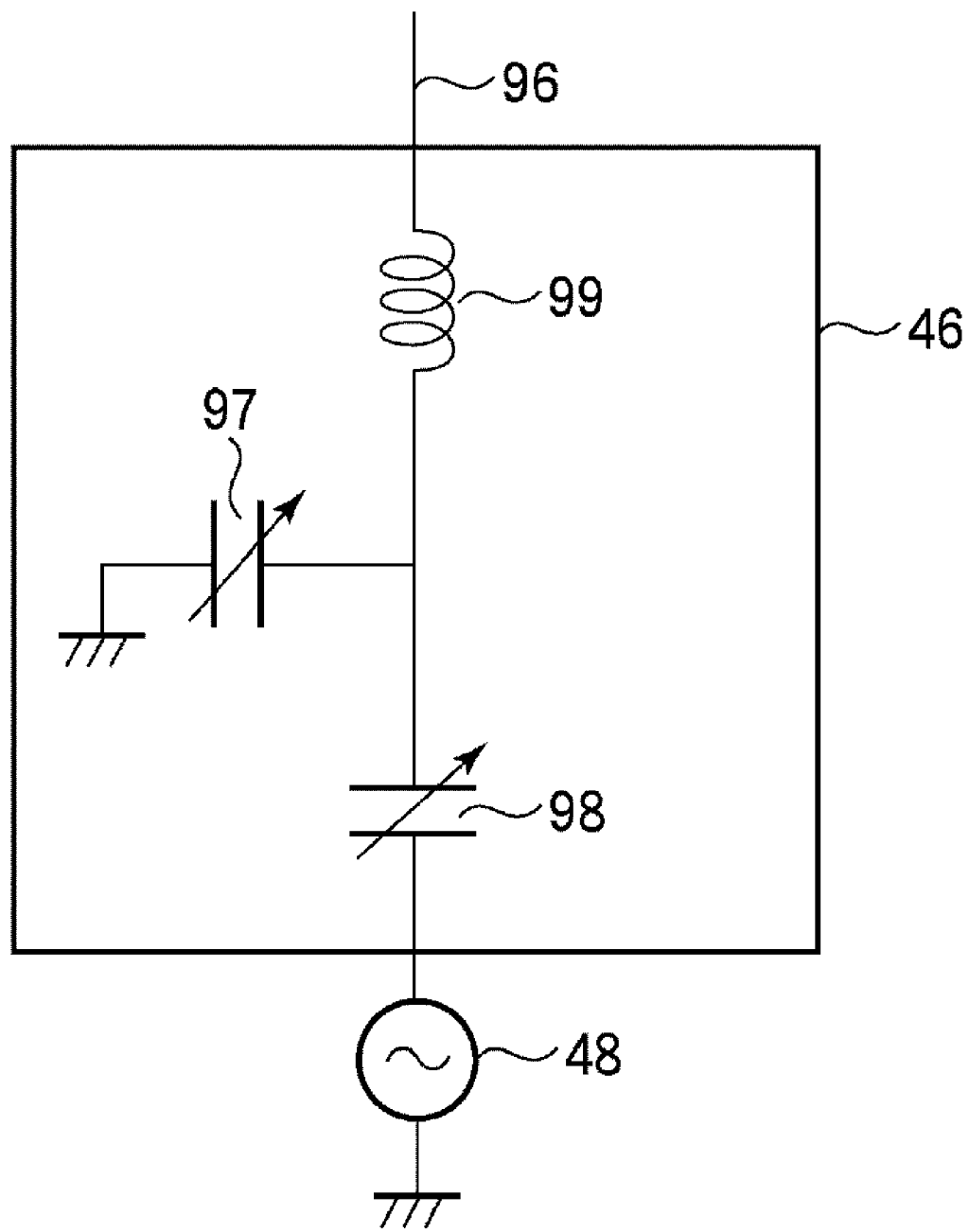
FIG. 2 is a view showing a configuration of a first matching unit connected with a first high frequency power supply of the plasma etching apparatus of FIG. 1.

The susceptor 16 as a lower electrode is electrically connected with a first high frequency power supply 48 for plasma generation via a first matching unit 46. The first high frequency power supply 48 outputs a high frequency power in the range from about 27 to about 100 MHz, for example, 40 MHz. The first matching unit 46 matches a load impedance with an internal (or output) impedance of the first high frequency power supply 48. When plasma is generated within the chamber 10, the first matching unit 46 makes the output impedance of the first high frequency power supply 48 and the load impedance apparently matched with each other. As illustrated in FIG. 2, the first matching unit 46 includes a first variable capacitor 97 branched from a branch point on a power feed line 96 of the first high frequency power supply 48, a second variable capacitor 98 provided between the branch point of the power feed line 96 and the first high frequency power supply 48, and a coil 99 provided opposite to the branch point.

Further, the susceptor 16 serving as a lower electrode is electrically connected with a second high frequency power supply 90 via a second matching unit 88. A high frequency power is supplied from the second high frequency power supply 90 to the susceptor 16 serving as a lower electrode, and, thus, a bias is applied to the semiconductor wafer W and ions are implanted into the semiconductor wafer W. The second high frequency power supply 90 outputs a high frequency power in the range from about 400 kHz to about 13.56 MHz, for example, 3 MHz. The second matching unit 88 matches a load impedance with an internal (or output) impedance of the second high frequency power supply 90. When plasma is generated within the chamber 10, the second matching unit 88 makes the internal impedance of the second high frequency power supply 90 and the load impedance including the plasma within the chamber 10 apparently matched with each other.

The first DC power supply 50, the first high frequency power supply 48, the second high frequency power supply 90, the first matching unit 46 and the second matching unit 88 are electrically connected with and controlled by a power supply controller 95.

To elaborate, the power supply controller 95 can control an on/off operation and an output of the first high frequency power supply 48. Therefore, the power supply controller 95 is capable of setting up a mode for generating plasma by continuously turning on the first high frequency power supply 48 and a mode for alternating a plasma presence state and a plasma absence state in, e.g., a pulse pattern by turning on and off the first high frequency power supply 48 alternately. Further, the power supply controller 95 is also capable of controlling an on/off operation and an output of the second high frequency power supply 90 for bias application. Therefore, the power supply controller 95 is capable of setting up a mode for continuously applying a bias at a certain output during a plasma process, and the power supply controller 95 is also capable of controlling an output of the second high frequency power supply 90 in synchronization with an on-off operation of the first high frequency power supply 48 in, e.g., a pulse pattern. Further, the power supply controller 95 can also control an on/off operation and a current·voltage of the first DC power supply 50.

In the present embodiment, unlike in a typical plasma etching process, when a high frequency power from the first high frequency power supply 48 is turned on and off in a certain cycle (period), the power supply controller 95 controls a matching operation of the first matching unit 46 in synchronization with the on/off operation of the first high frequency power supply 48.

In such a case, when the first high frequency power supply 48 is operated in the on/off mode, the power supply controller 95 controls the first matching unit 46 not to operate if the variable capacitors cannot follow up the on/off operation. The second matching unit 88 basically has the same configuration of the first matching unit 46. When the power supply controller 95 controls an output of the second high frequency power supply 90 in synchronization with the on/off operation of the first high frequency power supply 48, the power supply controller 95 controls the second matching unit 88 not to operate if variable capacitors cannot follow up the one/off operation.

However, in case that the operations of the variable capacitors of the first matching unit 46 and the second matching unit 88 are fast enough, the first matching unit 46 may be controlled so as to match the internal impedance of the first high frequency power supply 48 with the load impedance including the plasma within the chamber 10, and the second matching unit 88 may be controlled so as to match the internal impedance of the second high frequency power supply 90 and the load impedance including the plasma within the chamber 10.

Installed at a bottom portion of the chamber 10 is an exhaust port 80, which is connected with a gas exhaust unit 84 via an exhaust line 82. The gas exhaust unit 84 is configured to depressurize the inside of the chamber 10 to a predetermined vacuum level with a vacuum pump such as a turbo-molecular pump. Further, provided at the sidewall of the chamber 10 is a loading/unloading port 85 for the semiconductor wafer W. The loading/unloading port 85 can be opened and closed by a gate valve 86. Furthermore, detachably installed along an inner wall of the chamber 10 is a deposition shield 11 that prevents an etching byproduct (deposit) from being deposited onto the chamber 10. That is, the deposition shield 11 forms a chamber wall. The deposition shield 11 is also installed at an outer periphery of the inner wall member 26. At a bottom portion of the chamber 10, there is provided an exhaust plate 83 between the deposition shield 11 of the chamber wall and the deposition shield 11 of the inner wall member 26. The deposition shield 11 and the exhaust plate 83 can be made of an aluminum material coated with ceramic such as $Y_2O_3$.

A conductive member (GND block) 91, which is DC-connected to the ground, is provided on the deposition shield 11's chamber inner wall at the substantially same height as that of the wafer W. With this configuration, an abnormal electric discharge can be prevented. Further, the location of the conductive member 91 is not limited to the example shown in FIG. 1 as long as the conductive member 91 is located within a plasma generation region. For example, the conductive member 91 may be provided on the side of the susceptor 16, e.g., around the susceptor 16 and it may be also provided in the vicinity of the upper electrode 34. For instance, the conductive member 91 may be provided outside the upper electrode 34 in a ring shape.

Each component of the plasma processing apparatus, such as a power supply system, a gas supply system, a driving unit, or the power supply controller 95, is configured to be connected with and controlled by a controller (overall control unit) 100 including a microprocessor (computer). The controller 100 is connected with a user interface 101 including a keyboard through which an operator inputs a command to manage the plasma processing apparatus and a display on which an operation status of the plasma processing apparatus is displayed.

Further, the controller 100 is connected with a storage unit 102 for storing therein: a control program by which the controller 100 controls various kinds of processes performed in the plasma processing apparatus; and a program, i.e., a processing recipe, which allows each component of the plasma processing apparatus to perform a process according to a processing condition. The processing recipe is stored in a storage medium of the storage unit 102. The storage medium may be a hard disc or a semiconductor memory, or may be a portable medium such as a CD-ROM, a DVD, and a flash memory. Alternatively, the processing recipe may be appropriately received from an external apparatus through a dedicated line.

If necessary, a required recipe is retrieved from the storage unit 102 and executed by the controller 100 in response to an instruction from the user interface 101, whereby a predetermined process is performed in the plasma etching apparatus under the control of the controller 100. The plasma processing apparatus (plasma etching apparatus) described in the embodiments of the present disclosure may include this controller 100.

Now, a plasma etching method in accordance with the first embodiment of the present disclosure, which is performed by the plasma etching apparatus of FIG. 1 having the above-described configuration, will be described.

Figure 3:
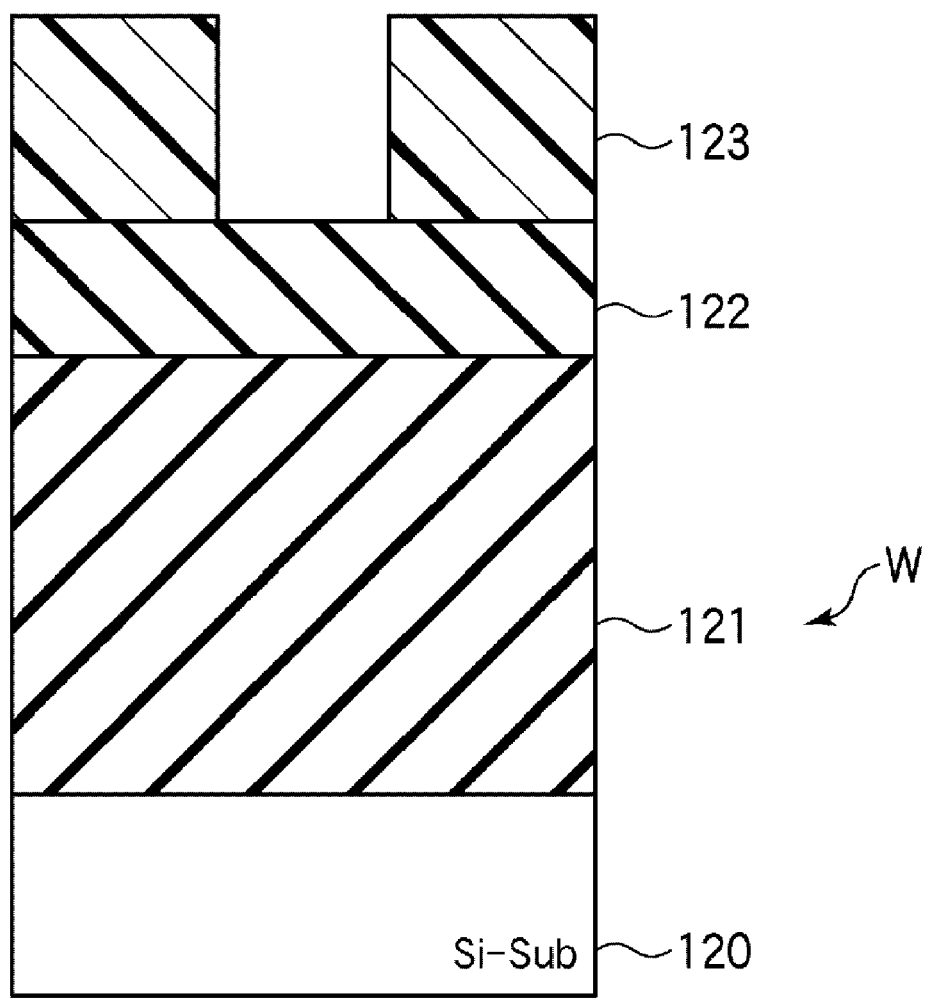
FIG. 3 is a cross sectional view illustrating an example structure of a semiconductor wafer as a processing target object on which the plasma etching method in accordance with the first embodiment of the present disclosure is performed.

For example, a semiconductor wafer W as illustrated in FIG. 3 is prepared. As for a structure of the semiconductor wafer W, an insulating film 121 is formed on a Si substrate 120, and an amorphous carbon film 122 as an organic film is formed on the insulating film 121 to serve as a hard mask, i.e., an etching mask. Further, a photoresist film (e.g., an ArF resist film) 123 patterned by photolithography is formed on the amorphous organic carbon film 122 to be used as an etching mask. Plasma etching is performed on the insulating film 121 of the semiconductor wafer W.

In the plasma etching process, the gate valve 86 is opened, and the semiconductor wafer W having the above-described structure is loaded into the chamber 10 through the loading/unloading port 85 and mounted on the susceptor 16. Then, after the gate valve 86 is closed, the processing gas is supplied from the processing gas supply source 66 into the gas diffusion space 40 at a predetermined flow rate and then introduced into the chamber 10 through the gas through holes 41 and the gas discharge holes 37. At the same time, the inside of the chamber 10 is evacuated by the gas exhaust unit 84 so as to set a internal pressure of the chamber 10 to be in the range of, e.g., about 0.1 Pa to about 150 Pa. Then, by applying a high frequency power and a DC voltage, a plasma etching process is performed on the wafer W. At this time, the semiconductor wafer W is held onto the electrostatic chuck 18 by the DC voltage applied from the DC power supply 22 to the electrode 20 of the electrostatic chuck 18.

In this case, conventional gases as a processing gas may be used. For example, a halogen-containing gas, typically, a fluorocarbon gas (CxFy) such as $C_4F_8$ can be used. Further, the processing gas may include another gas such as an Ar gas or an $O_2$ gas.

Conventionally, in the plasma etching process, to the susceptor serving as a lower electrode, the first high frequency power supply 48 applies a high frequency power for plasma generation with a relatively high frequency ranging from about 27 to about 100 MHz, e.g., 40 MHz and the second high frequency power supply 90 continuously applies a high frequency power for ion implantation with a frequency ranging from about 400 kHz to about 13.26 MHz, e.g., 3 MHz lower than the frequency of the high frequency power for plasma generation. Further, a preset DC voltage is continuously applied from the variable DC power supply 50 to the upper electrode 34.

The processing gas discharged from the gas discharge holes 37 formed in the electrode plate 36 of the upper electrode 34 is excited into plasma during a glow discharge generated by a high frequency power between the upper electrode 34 and the susceptor 16 serving as a lower electrode. By radicals or positive ions generated in the plasma, the insulating film 121 of the semiconductor wafer W is etched while using the photoresist film 123 and the amorphous carbon film 122 as a mask.

At this time, the plasma can be generated closer to the wafer W and the plasma is not diffused widely by applying the high frequency power for plasma generation to the lower electrode, and, thus, dissociation of the processing gas can be suppressed. Accordingly, even under condition that the internal pressure of the chamber 10 is high and the plasma density is low, it is possible to increase an etching rate. Further, even in case that the high frequency power for plasma generation has a high frequency, it is possible to obtain a relatively high ion energy with high efficiency. Since the high frequency power for plasma generation and the high frequency power for ion implantation are separately applied to the lower electrode as described in the present embodiment, it is possible to independently control the plasma generation and the ion implantation, which are required for plasma etching. Accordingly, it is possible to meet the conditions of an etching process requiring high microprocessing. Further, since a plasma generation high frequency power having a high frequency of about 27 MHz or higher is supplied, it is possible to increase density of plasma in a desired state, and, thus, even under the lower pressure condition, high-density plasma can be generated.

In this way, when the plasma is generated, since a negative DC voltage is applied to the upper electrode 34 from the variable DC power supply 50, positive ions in the plasma collide with the upper electrode 34, whereby secondary electrons are generated in the vicinity of the upper electrode 34. Then, the secondary ions are accelerated downward in a vertical direction, and the accelerated secondary electrons (high-velocity electrons) can be supplied to the semiconductor wafer W as the processing target object. At this time, the electrons supplied to the semiconductor wafer W function to modify and reinforce the photoresist film (especially, ArF photoresist film) 123 and the amorphous carbon film, which are organic films having low etching resistance.

Figure 4:
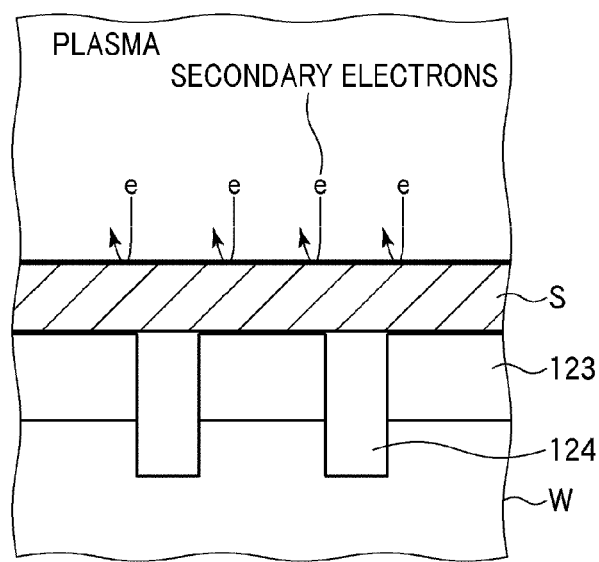
FIG. 4 is a diagram illustrating a behavior of secondary electrons generated by a negative DC voltage applied to an upper electrode when a plasma sheath is thick.

However, such an organic mask modifying effect by the high-velocity electrons depends on a plasma sheath thickness on the semiconductor wafer W. That is, during the etching, not only the high frequency power from the first high frequency power supply 48 but also the high frequency power for bias application from the second high frequency power supply 90 is applied. Accordingly, the plasma sheath thickness increases, as illustrated in FIG. 4. Such a thick plasma sheath becomes a barrier, and, thus, electrons cannot be supplied to the photoresist film 123 sufficiently, resulting in a failure to achieve a sufficient modifying effect. In FIG. 4, a reference numeral 124 denotes a contact hole.

Figure 5:
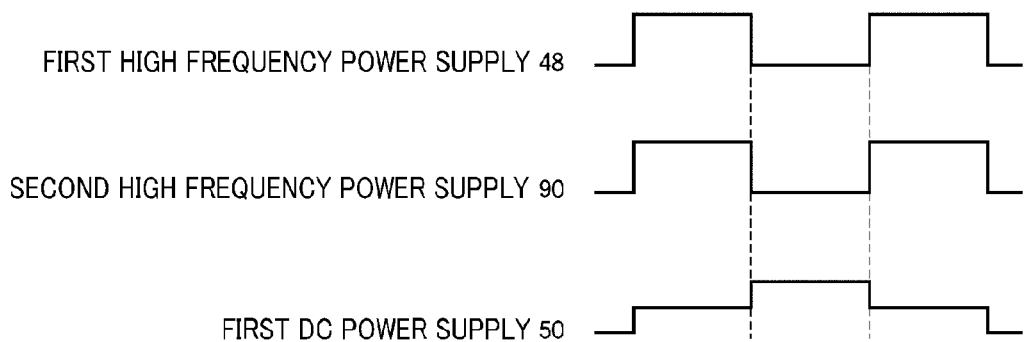
FIG. 5 is a timing chart showing an operational status of the first high frequency power supply, a second high frequency power supply and a first DC power supply in the plasma etching method in accordance with the first embodiment of the preset disclosure.
Figure 6:
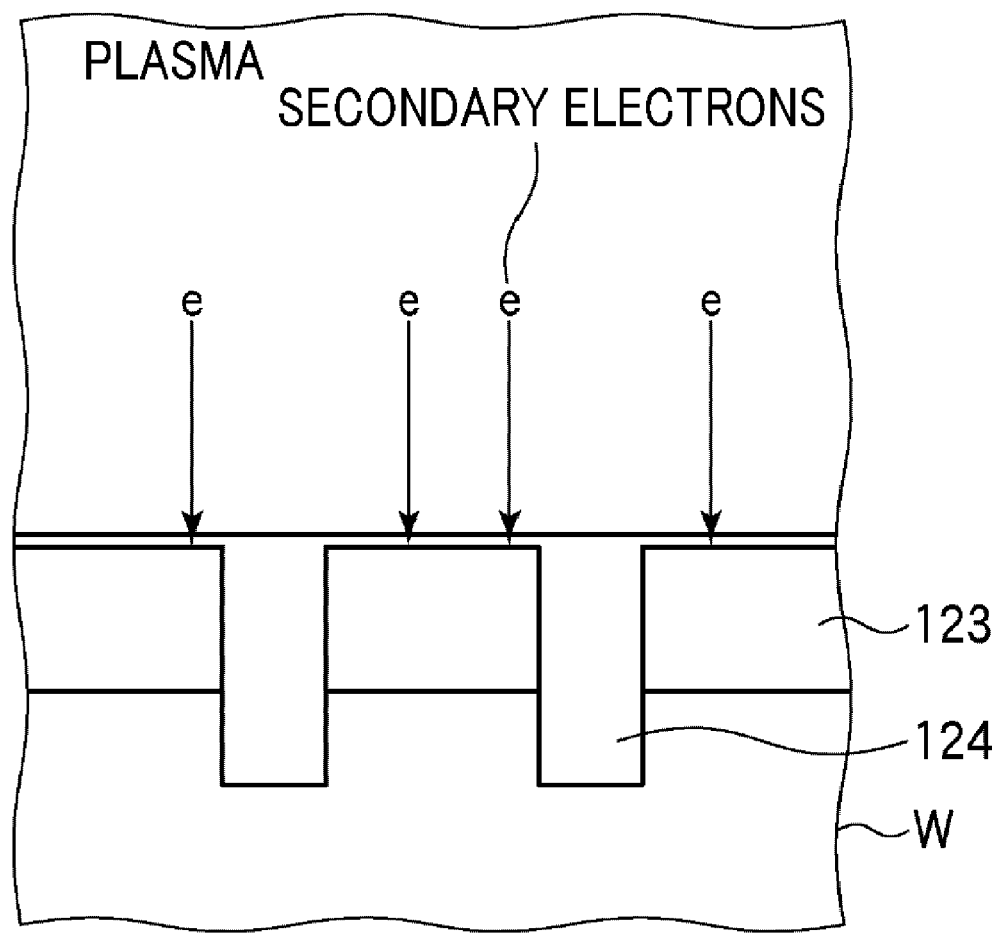
FIG. 6 is a diagram illustrating a behavior of secondary electrons generated by a negative DC voltage applied to the upper electrode in the absence of a plasma sheath.

In view of the foregoing, in the present embodiment, the first high frequency power supply 48 for plasma generation is turned on and off alternately, and the second high frequency power 90 for bias application is turned on and off alternately, in synchronization with the on/off operation of the first high frequency power supply 48, as illustrated in FIG. 5. Accordingly, as shown in FIG. 6, a plasma-on state in which plasma (glow plasma) is generated by the first high frequency power supply 48 and a plasma-off state in which glow plasma is not generated are alternately repeated. In synchronization with the on and off of the plasma, the first DC power supply 50 applies a negative DC voltage to the upper electrode 34 such that an absolute value of the applied negative DC voltage during a plasma-off period is greater than that of the applied negative DC voltage during a plasma-on period.

During the plasma-on period when the above-described plasma process is performed, a very thick plasma sheath as illustrated in FIG. 4 is formed because a plasma sheath generated by the first high frequency power supply 48 and a plasma sheath generated by the second high frequency power supply 90 for bias application are combined. As a result, the electrons are reflected from the plasma sheath. During the plasma-off period, however, since both the first high frequency power supply 48 and the second high frequency power supply 90 are turned off, the plasma sheath is hardly formed, and, thus, the secondary electrons (high-velocity electrons) are allowed to reach the semiconductor wafer W readily, as illustrated in FIG. 6. Therefore, modification and reinforcement of the photoresist film (especially, ArF photoresist film) 123 can be carried out effectively. Likewise, modification and reinforcement of the amorphous carbon film 122 as an organic mask can also be performed effectively.

As stated, by alternating the plasma-on period and the plasma-off period and applying the high frequency voltage from the first DC power supply 50 such that an absolute value of the applied high frequency voltage during the plasma-off period is greater than that of the applied high frequency voltage during the plasma-on period, a great amount of electrons can be supplied to the photoresist film 123 and the amorphous carbon film 122 during the plasma-off. Thus, the photoresist film 123 and the amorphous carbon film 122 can be reinforced more effectively.

Figure 7:
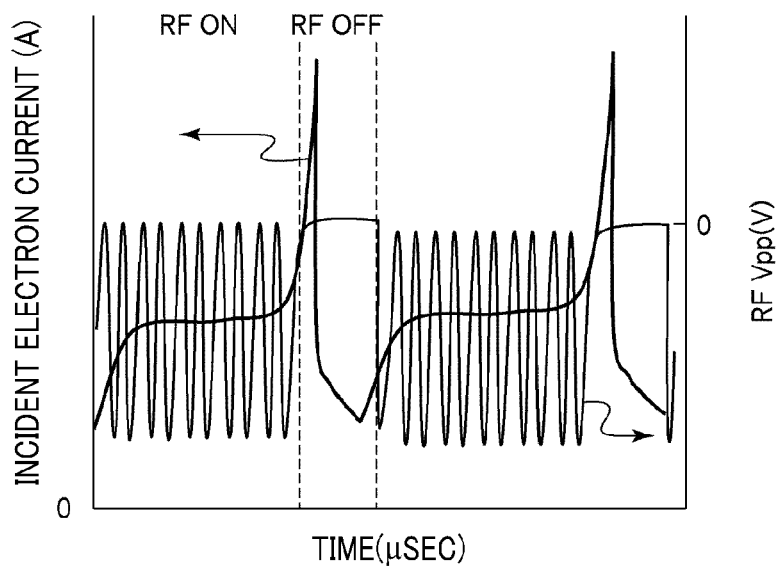
FIG. 7 is a graph showing a relationship between on and off of a high frequency power and an incident electron current on a wafer in the plasma etching method in accordance with the first embodiment of the present disclosure.

FIG. 7 shows a relationship between on and off of plasma synchronized with on and off of high frequency (RF) power and an incident electron current A on the semiconductor wafer W, which indicates the amount of electrons incident on the semiconductor wafer W. As can be seen from FIG. 7, during the period when the plasma is off by turning off the high frequency (RF) power, the incident electron current increases, and, thus, a great amount of electrons are supplied during the plasma-off period.

The DC voltage applied during the plasma-on period may be set depending on plasma to be generated, and it may be in the range of, e.g., about 0 V to −300 V. Further, the DC voltage applied during the plasma-off period only needs to have an absolute value greater than that of the DC voltage applied during the plasma-on period. For the modification of the photoresist film 123 or the like, the greater the absolute value is, the better the modifying effect is. Thus, there is no upper limit of the absolute value. However, if tolerance of the apparatus is considered, it is desirable that the absolute value is actually smaller than an absolute value of −2000 V.

The plasma-off period is desirably equal to or less than about 50 μsec. If it exceeds 50 μsec, a time period that does not contribute to the etching increases, resulting in deterioration of efficiency.

Figure 8:
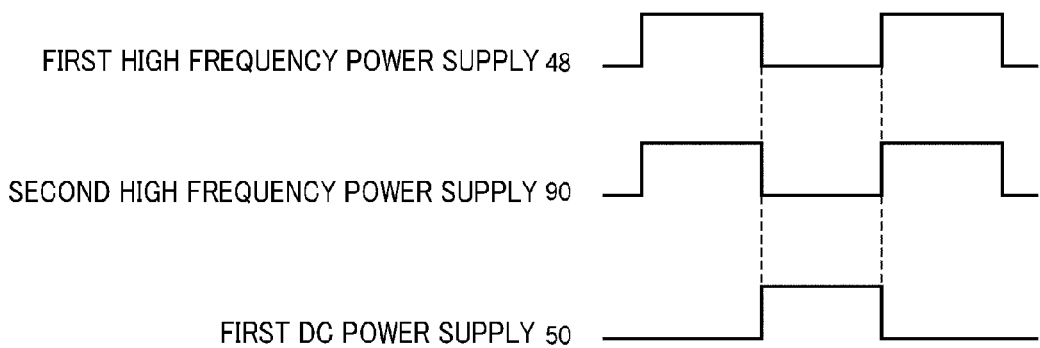
FIG. 8 is a timing chart illustrating another example operational status of the first high frequency power supply, the second high frequency power supply and the first DC power supply in the plasma etching method in accordance with the first embodiment of the present disclosure.

Moreover, as illustrated in FIG. 8, the DC voltage from the first DC power supply 50 may be turned off during the plasma-on period, while it is turned on during the plasma-off period.

Although the present embodiment is applicable to any case in which an organic film such as an ArF photoresist film having low plasma resistance is formed, the present embodiment is especially efficient when applied to a HARC process requiring a high Vpp. It is because a plasma sheath thickness increases in the HARC process due to an increase of Vdc caused by the high Vpp. In a process having a high Vpp, Vpp ranges from about 3000 V to about 4000 V, and Vdc ranges from about −1500 V to about −2000 V. Further, when Vdc of the upper electrode and Vdc of the lower electrode are expressed as Vdc (top) and Vdc (bottom), respectively, it is desirable to satisfy a condition of Vdc (top)>Vdc (bottom) to achieve an organic film modifying effect.

Figure 9:
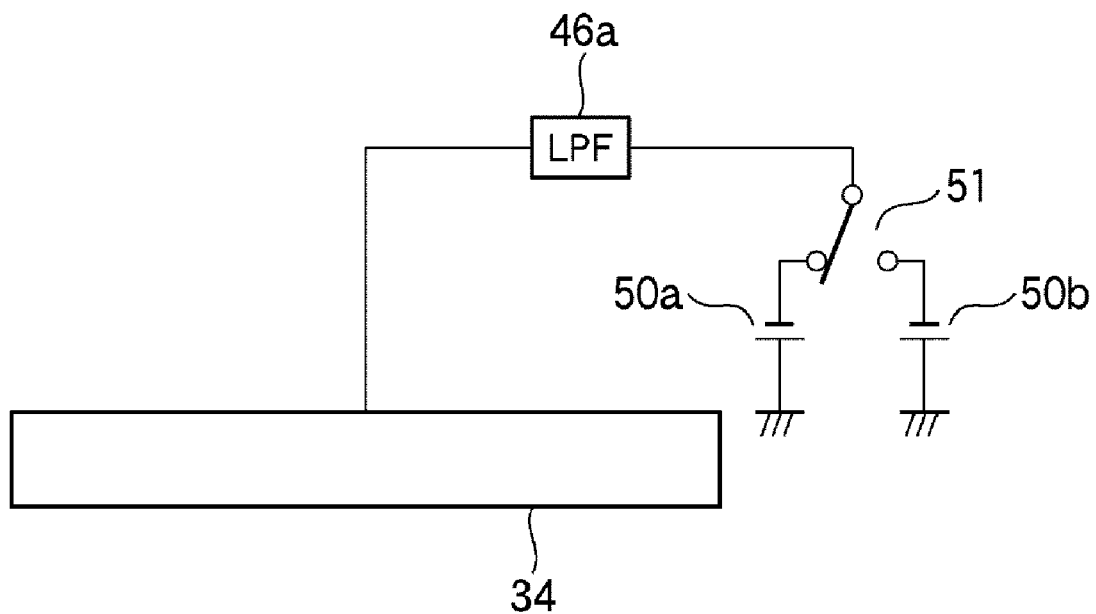
FIG. 9 is a schematic diagram illustrating another example first DC power supply of the apparatus of FIG. 1.

Furthermore, the method of the present embodiment may be performed by another apparatus as shown in FIG. 9 instead of the apparatus shown in FIG. 1. This apparatus uses a first DC power supply including a low-voltage application DC power supply 50a that applies a relatively low DC voltage during the plasma-on period and a high-voltage application DC power supply 50b that applies a relatively high DC voltage during the plasma-off period. The two DC power supplies 50a and 50b are switched by a switch 51. With this configuration, alternation of the DC voltage can be carried out more simply.

Now, an experiment conducted to prove an effect of the method of the present embodiment will be described.

In the experiment, there was prepared a sample having an oxide film of about 3000 nm formed on a silicon substrate; an amorphous carbon film of about 900 nm formed on the oxide film as a mask; and an ArF photoresist film patterned by photolithography and formed on the amorphous carbon film. A remaining thickness of the amorphous carbon film was measured for two different cases. In one case, the oxide film was etched by continuously applying a DC voltage of about −150 V from the first DC power supply 50 to the upper electrode while synchronously turning on and off the first and second high frequency power supplies 48 and 90. At this time, the absolute value of the DC voltage was maintained low. In the other case, the oxide film was etched by increasing the absolute value of the DC voltage (DC voltage: −1200 V) when the first and second high frequency power supplies 48 and 90 are turned off. If the degree of reinforcement of the organic films, i.e., the ArF photoresist film and the amorphous carbon film, is high, the remaining thickness of the amorphous film would be increased because the ArF photoresist film would remain for a long time and etching resistance of the amorphous carbon film would be high during the plasma etching.

As a result of the experiment, when the etching was performed by continuously applying the DC voltage maintained constant, the remaining thickness of the amorphous carbon film was about 430 nm. When the DC voltage was applied in a pulse pattern in accordance with the present embodiment, however, the remaining thickness of the amorphous carbon film was found to be about 485 nm.

Second Embodiment

Hereinafter, a second embodiment of the present disclosure will be described.

Figure 10:
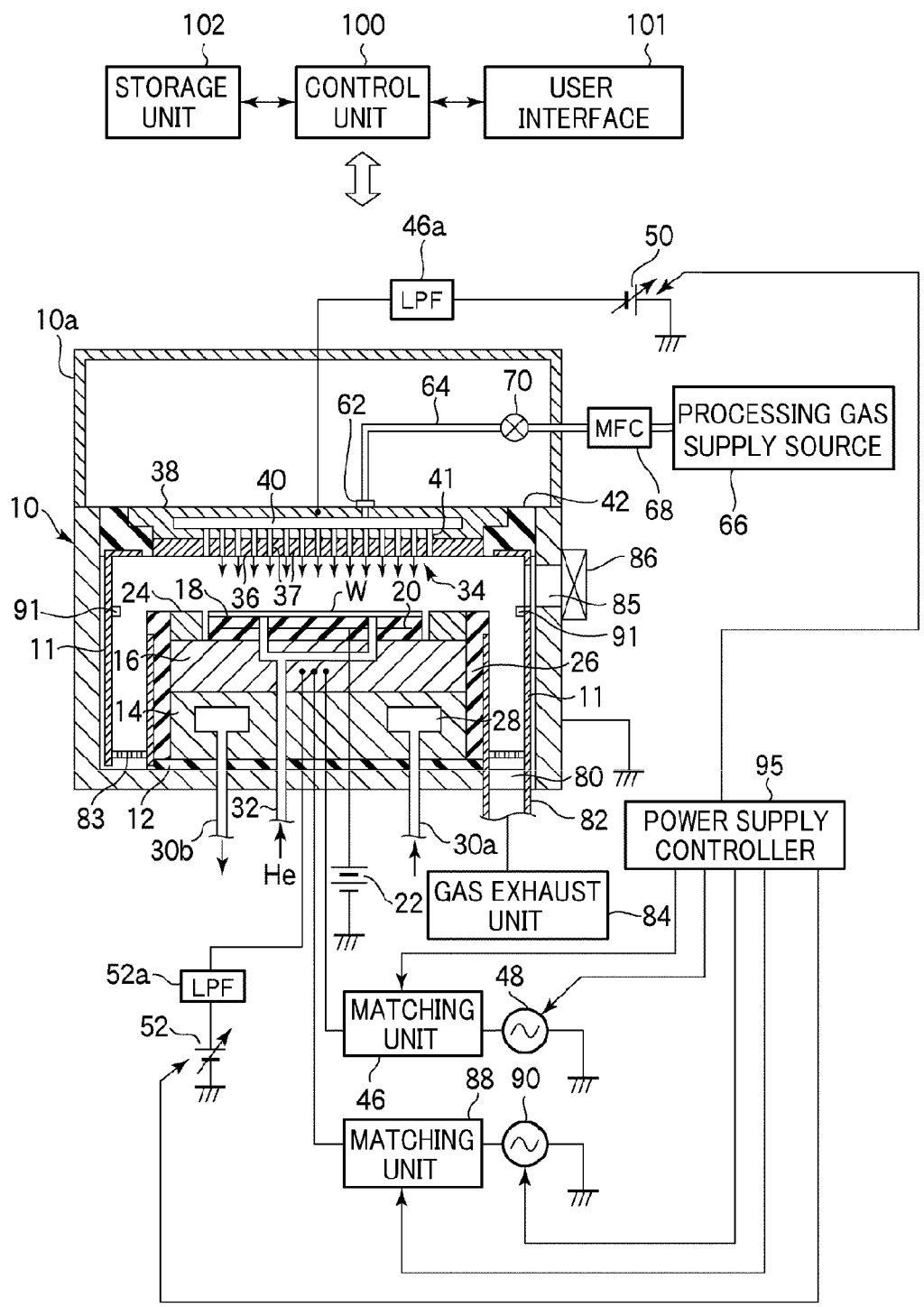
FIG. 10 is a schematic cross sectional view illustrating an example plasma etching apparatus capable of performing a plasma etching method in accordance with a second embodiment of the present disclosure.

FIG. 10 is a schematic cross sectional view illustrating an example plasma etching apparatus capable of performing a plasma etching method in accordance with the second embodiment of the present disclosure.

The plasma etching apparatus shown in FIG. 10 has the same configuration as that of the apparatus shown in FIG. 1 excepting that an anode of a second DC power supply 52 is connected to the side of a susceptor 16 serving as a lower electrode via a low pass filter (LPF) 52a so as to apply a positive (plus) voltage to the susceptor 16 serving as the lower electrode; and the second DC power supply 52 is controlled by a power supply controller 95. Accordingly, in FIG. 10, the same parts as described in FIG. 1 will be assigned same reference numerals, and redundant description will be omitted.

Now, the plasma etching method in accordance with the second embodiment, which is performed by the plasma etching apparatus of FIG. 10, will be discussed.

Figure 11:
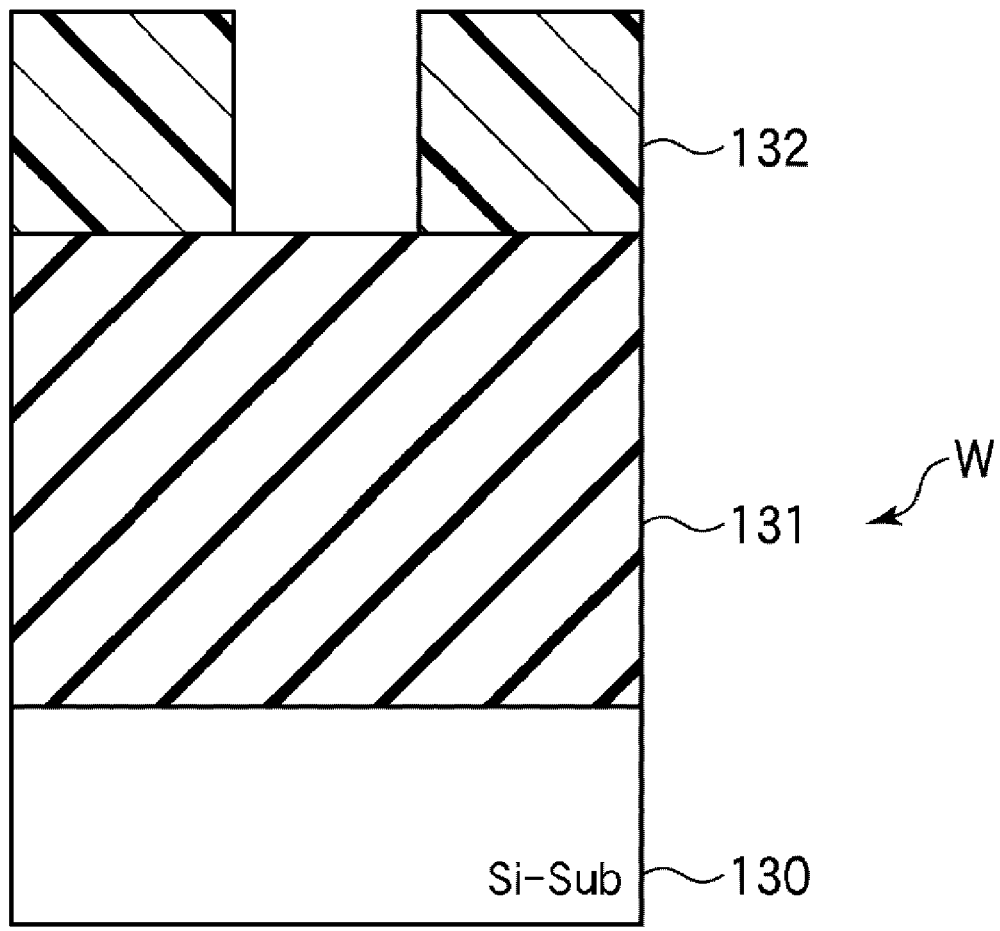
FIG. 11 is a cross sectional view illustrating an example structure of a semiconductor wafer as a processing target object on which the plasma etching method in accordance with the second embodiment of the present disclosure is performed.

Here, a high-aspect-ratio contact-hole etching (HARC etching) is performed. For example, as illustrated in FIG. 11, there is prepared a semiconductor wafer W having an insulating film 131 formed on a Si substrate 130; and a photoresist film 132 as an etching mask patterned by photolithography and formed on the insulating film 131. The HARC etching is performed on the insulating film 131.

First, a gate valve 86 is opened, and the semiconductor wafer W having the above-described structure is loaded into a chamber 10 through a loading/unloading port 85 and mounted on the susceptor 16. Then, the processing gas is supplied from the processing gas supply source 66 into the gas diffusion space 40 at a predetermined flow rate and then introduced into the chamber 10 through the gas through holes 41 and the gas discharge holes 37. At the same time, the inside of the chamber 10 is evacuated by the gas exhaust unit 84 so as to set a internal pressure of the chamber 10 to be in the range of, e.g., about 0.1 Pa to about 150 Pa. In this state, to the susceptor serving as a lower electrode, the first high frequency power supply 48 applies a high frequency power for plasma generation with a relatively high frequency ranging from about 27 to about 100 MHz, e.g., 40 MHz and the second high frequency power supply 90 continuously applies a high frequency power for ion implantation with a frequency ranging from about 400 kHz to about 13.26 MHz, e.g., 3 MHz lower than the frequency of the high frequency power for plasma generation. Further, a preset DC voltage is continuously applied from a variable DC power supply 50 to an upper electrode 34, whereby a first process of an etching is performed on the semiconductor wafer W. At this time, the semiconductor wafer W is held onto the electrostatic chuck 18 by the DC voltage applied from the DC power supply 22 to the electrode 20 of the electrostatic chuck 18.

In this case, as in the first embodiment, conventional gases may be used as a processing gas. For example, a halogen-containing gas, typically, a fluorocarbon gas (CxFy) such as $C_4F_8$ can be used. Further, the processing gas may include another gas such as an Ar gas or an $O_2$ gas.

The processing gas discharged from the gas discharge holes 37 formed in the electrode plate 36 of the upper electrode 34 is excited into plasma during a glow discharge generated by a high frequency power between the upper electrode 34 and the susceptor 16 serving as a lower electrode. By radicals or positive ions generated in the plasma, the insulating film 131 of the semiconductor wafer W is etched.

Basic effects of the etching by the plasma generated as described above are the same as those of the first embodiment.

Figure 12:
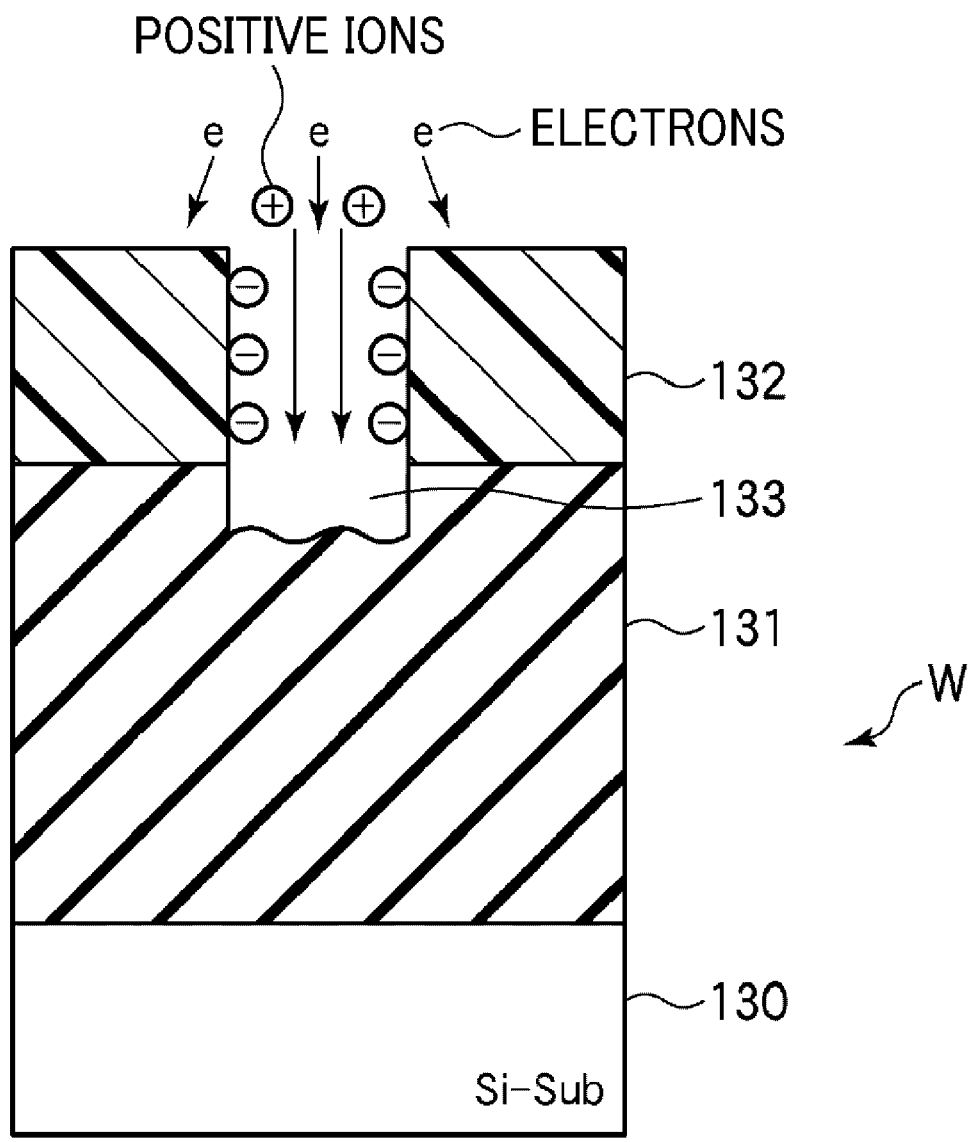
FIG. 12 is a cross sectional view schematically illustrating a state of the processing target object in the early stage of etching.

The etching is mainly carried out by positive ions in the plasma. In the early stage of the etching, a contact hole 133 formed by the etching is shallow, and the photoresist film 132 is negatively charged with electrons in the plasma, as illustrated in FIG. 12. Thus, the electrons are allowed to reach an etching surface, and electric charges are neutralized when the positive ions are supplied to the etching surface. Accordingly, the etching can progress normally.

Figure 13:
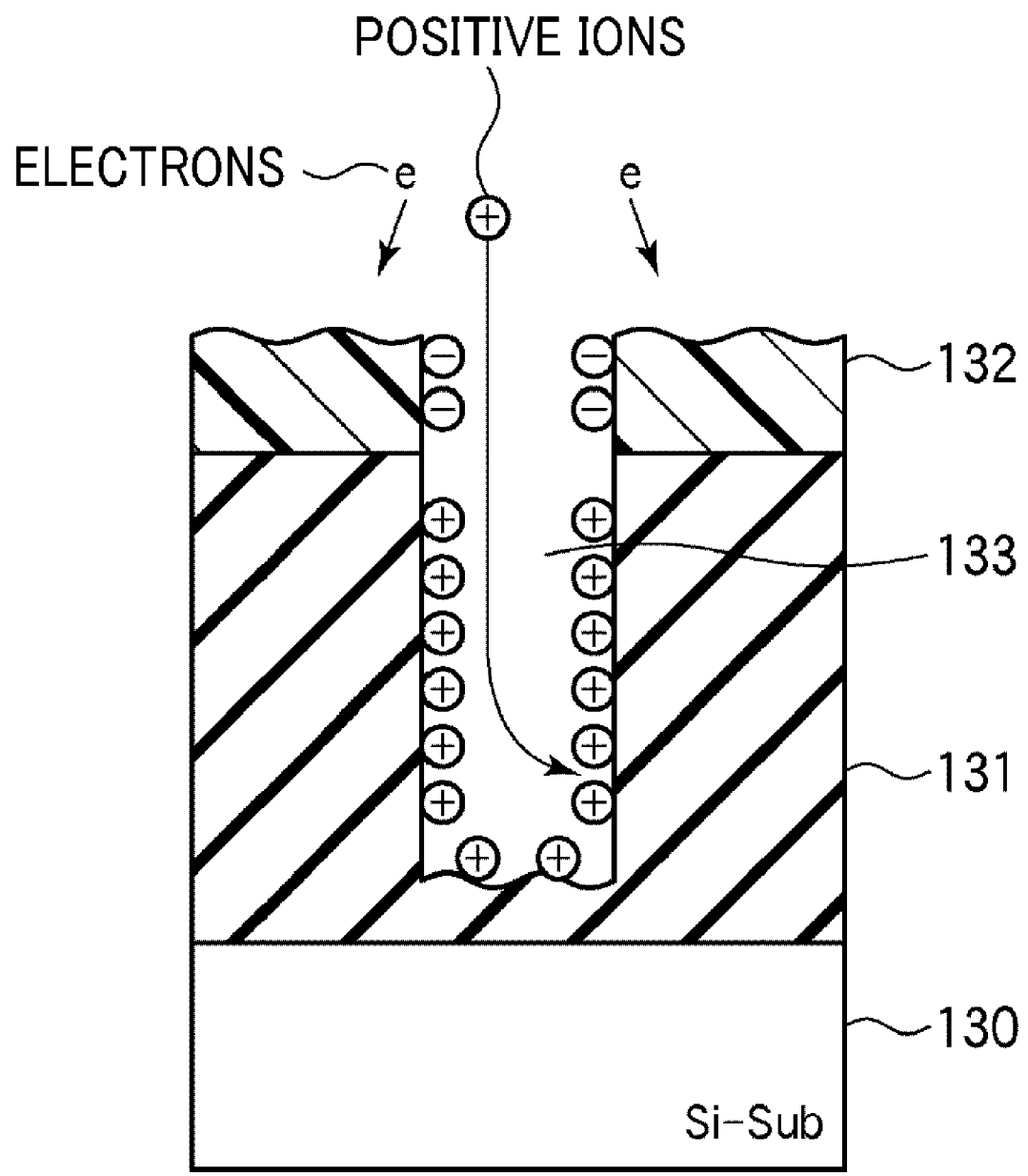
FIG. 13 is a cross sectional view schematically illustrating a state of the processing target object after the etching has progressed.

However, if an aspect ratio of the contact hole 133 increases, as illustrated in FIG. 13, as the etching progresses, it becomes difficult for the electrons to reach the inside of the contact hole 133. Accordingly, the positive ions are accumulated in the contact hole 133, and, thus, the etching surface gets positively charged.

If the etching progresses in this state, the positive ions that have reached the inside of the contact hole 133 for the etching change its direction due to a repulsion between the positive charges within the contact hole 133, resulting in warp or deformation of an etching shape. Further, shading damage is readily incurred due to the positive ions in the bottom of the contact hole 133. Moreover, since it becomes difficult for the positive ions to reach the bottom of the hole, an etching rate is decreased. Especially, when a contact hole having an aspect ratio greater than 40 is formed in a next-generation HARC etching, this problem gets conspicuous.

Figure 14:
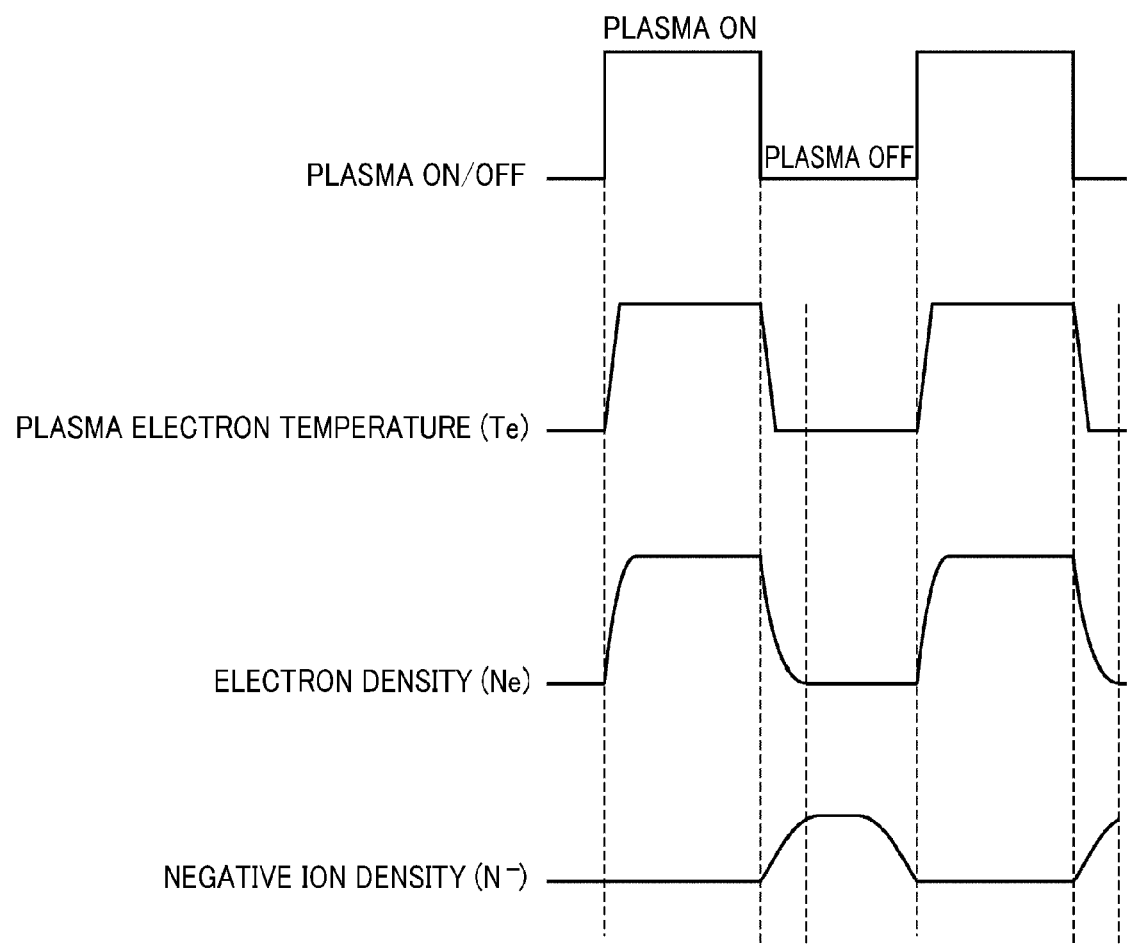
FIG. 14 is a timing chart showing a plasma electron temperature (Te), an electron density (Ne) and a negative ion density (N⁻) when plasma is turned on and off in a second process of the plasma etching method in accordance with the second embodiment of the present disclosure.

As a solution, in the second embodiment, after the etching has progressed to some extent, a second process of the etching is performed as follows. In this second process, by turning on and off the first high frequency power supply 48 for plasma generation alternately, a plasma-on state in which plasma (glow plasma) is generated by the first high frequency power supply 48 and a plasma-off state in which the glow plasma is not generated are alternately repeated, as illustrated in FIG. 14. A negative DC voltage is applied from the first DC power supply 50 to the upper electrode during both a plasma-on period and a plasma-off period, and a positive DC voltage is applied from the second DC power supply 52 to the susceptor 26 serving as the lower electrode during a plasma-off period.

In the second process, when the glow plasma is turned off by turning off the first high frequency power supply 48, a plasma electron temperature (Te) decreases rapidly and an electron density (Ne) also decreases. At this time, since inactivated electrons are adsorbed on molecules, the electron density (Ne) decreases with an increase of negative ions. A negative ion density (N$^-$) reaches the maximum when a preset time period has elapsed after the plasma was turned off.

Figure 15:
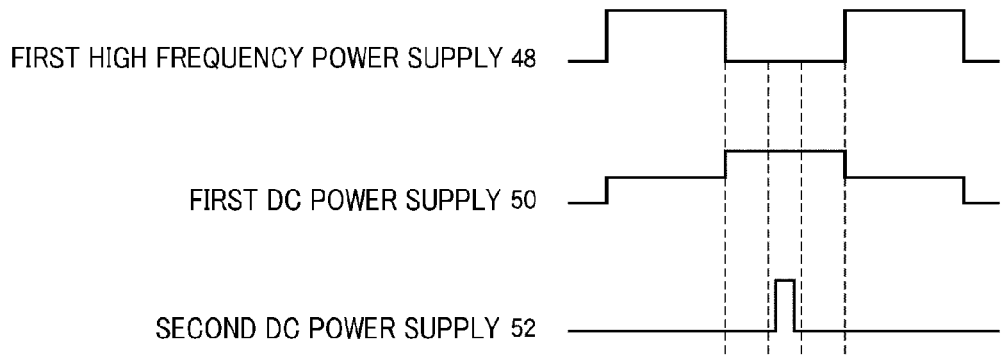
FIG. 15 presents a timing chart illustrating an operational status of a first high frequency power supply, a first DC power supply and a second DC power supply in the second process of the plasma etching method in accordance with the second embodiment of the present disclosure.

In view of the foregoing, in the second embodiment, electrons and negative ions are mainly supplied into the contact hole 133 by using the first and second DC power supplies 50 and 52, whereby the positive charges within the contact hole 133 are neutralized. Specifically, as shown in FIG. 15, the negative DC voltage is applied to the upper electrode 34 from the first DC power supply 50 during both the plasma-on period and the plasma-off period, which are alternated by the on/off operations of the first high frequency power supply 48. The positive DC voltage is applied to the susceptor 16 from the second DC power supply 52 during the plasma-off period set by the off operation of the first high frequency power supply 48.

Figure 16:
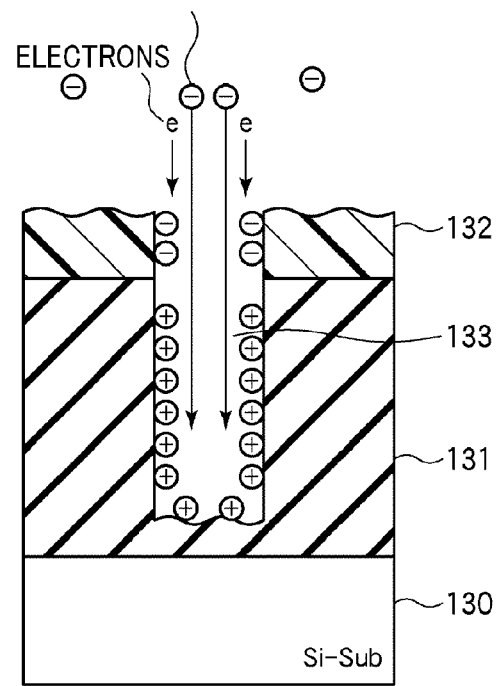
FIG. 16 is a schematic diagram showing a state when the first high frequency power supply for plasma generation is turned off in the second process of the plasma etching method in accordance with the second embodiment of the present disclosure.

Accordingly, in the early stage of plasma (after-glow plasma) maintained for about several tens of μsec after the first high frequency power supply 48 is turned off, a plasma sheath on the susceptor 16 is not exist because the first high frequency power supply 48 is turned off. Accordingly, secondary electrons generated from the upper electrode 34 and accelerated by the negative DC voltage applied from the first DC power supply 50 to the upper electrode 34; and negative ions generated during the glow plasma off are allowed to reach the wafer W without repulsion by the sheath. Further, in the middle and later stages of the after-glow plasma, a force for attracting the negative ions into the susceptor 16 serving as the lower electrode is exerted as the positive DC voltage is applied to the susceptor 16 from the second DC power supply 52. That is, as shown in FIG. 16, the electrons and the negative ions are attracted toward the susceptor 16 by the application of the negative DC voltage to the upper electrode 34 and are then attracted into the susceptor 16 by the application of the positive DC voltage to the susceptor 16. Accordingly, the electrons and the negative ions can be certainly implanted into the contact hole 133, thereby neutralizing the positive charges within the contact hole 133.

Figure 17:
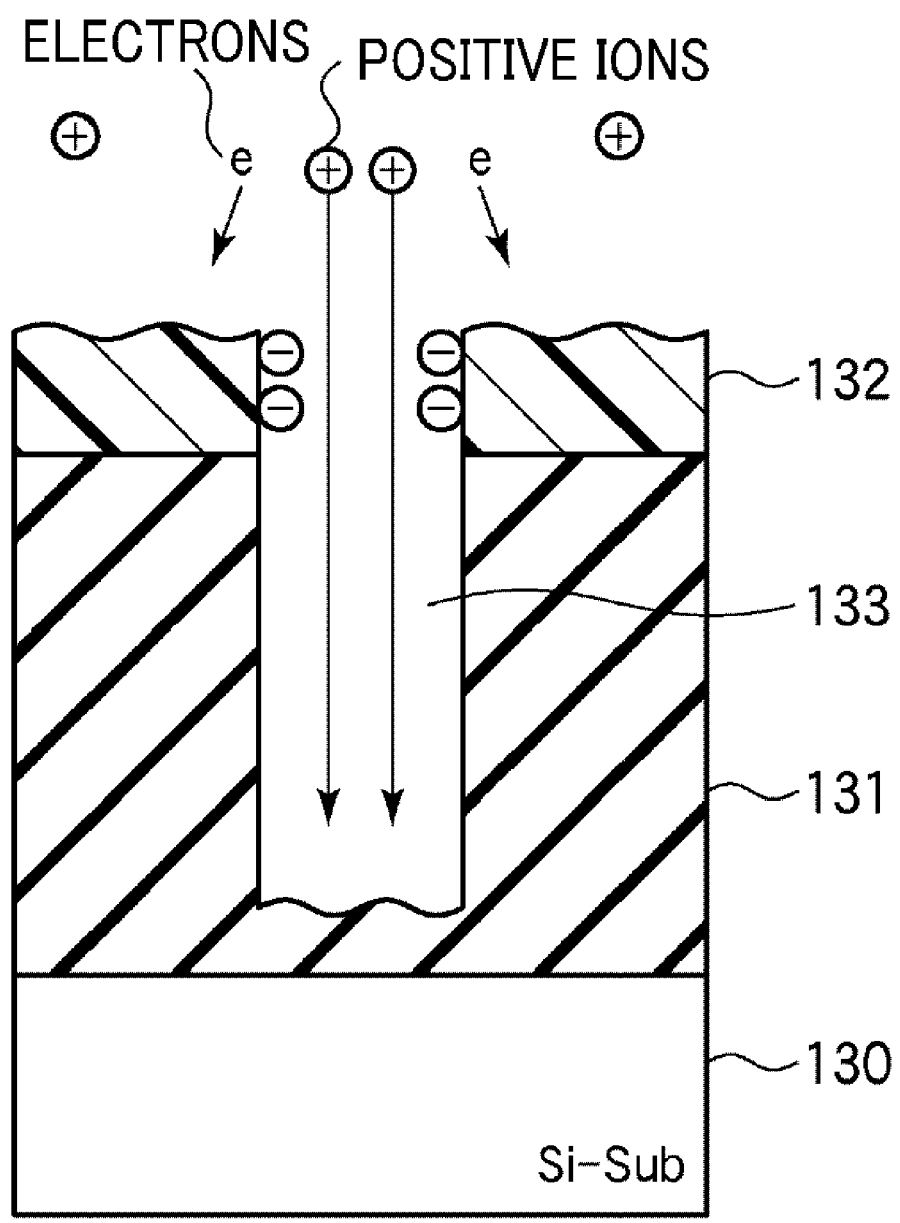
FIG. 17 is a schematic diagram illustrating a state when the first high frequency power supply is turned on after it is turned off in the second process of the plasma etching method in accordance with the second embodiment of the present disclosure.

As stated above, a regime in which the positive ions are mainly included due to the generation of the plasma (glow plasma) as a result of turning on the first high frequency power supply 48; and a regime in which the electrons and the negative ions are mainly included by turning off the first high frequency power supply 48 are alternately repeated. During the regime in which the electrons and the negative ions are dominant, the electrons and the negative ions are implanted into the contact hole 133 to thereby neutralize the positive charges in the contact hole. Since the amount of the positive charges within the contact hole 133 is reduced, the positive ions can travel straight within the contact hole 133, as illustrated in FIG. 17, when the first high frequency power supply 48 is turned on subsequently. As a result, a desirable etching shape can be achieved, and an etching rate can be increased. Furthermore, since the positive ions are not accumulated in the bottom of the contact hole 133, shading damage may not be caused readily.

Desirably, the positive DC voltage from the second DC power supply 52 may be applied only one time in a pulse pattern during the plasma-off period, as shown in FIG. 15. It is enough to apply the positive DC voltage only one time in a pulse pattern for the implantation of the negative ions. Further, it may be desirable to apply the positive DC voltage from the second DC power supply 52 in about 10 μsec to about 30 μsec after the first high frequency power supply 48 for plasma generation is turned off. During this interval, negative ions are mainly generated, so that the effect of implanting the negative ions improves. Moreover, as can be seen from FIG. 15, the absolute value of the DC voltage applied from the first DC power supply 50 to the upper electrode 34 is increased during the plasma-off period. As a result, the generation amount of the secondary electrons can be increased during the plasma-off period, and the effect of neutralizing the positive ions by the secondary electrons can be achieved. Here, it should be noted that the absolute value of the DC voltage needs to be limited within a range that does not contribute to the plasma generation. At this time, the negative DC voltage applied to the upper electrode 34 may be maintained constant.

In this second embodiment, the DC voltage from the first DC power supply 50 may be turned off during the plasma-on period and turned on during the plasma-off period, as in the first embodiment illustrated in FIG. 8.

As the negative ions are implanted into the contact hole by applying the positive DC voltage from the second DC power supply 52 to the susceptor 16 serving as the lower electrode during the plasma-off period, etching by the negative ions can be still carried out during the period of after-glow plasma, and, thus, an etching rate can increase. Furthermore, the secondary electrons generated by applying the negative DC voltage to the upper electrode 34 from the first DC power supply 50 contribute to the neutralization of electric charges within the hole.

Desirably, the plasma-off period may be equal to or less than about 50 μsec. If it exceeds about 50 μsec, a time period that does not contribute to the etching is lengthened, resulting in deterioration of efficiency.

Figure 18:
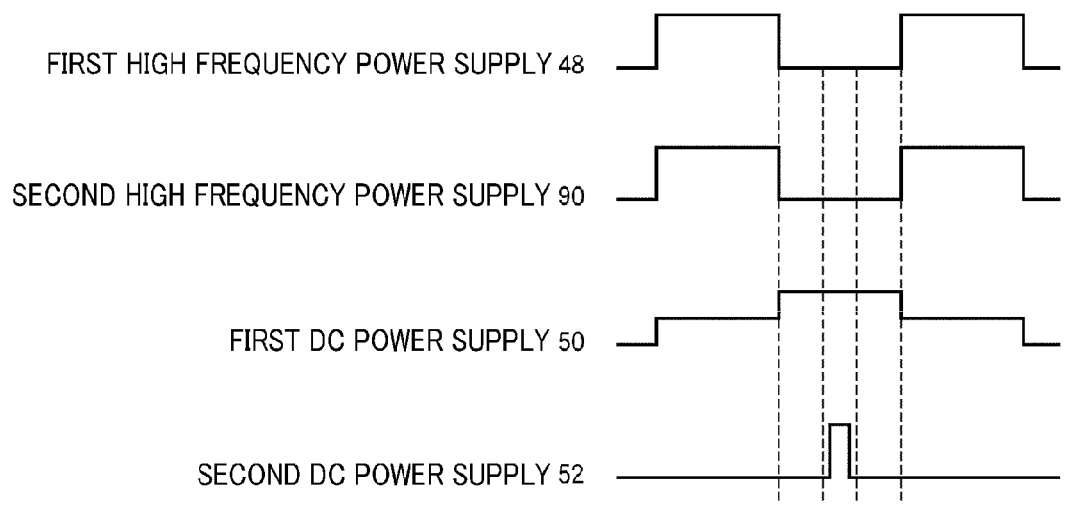
FIG. 18 is a timing chart showing an example of turning on and off the second high frequency power for bias application in synchronization with an on/off operation of the first high frequency power supply for plasma generation in the second process of the plasma etching method in accordance with the second embodiment of the present disclosure.
Figure 19:
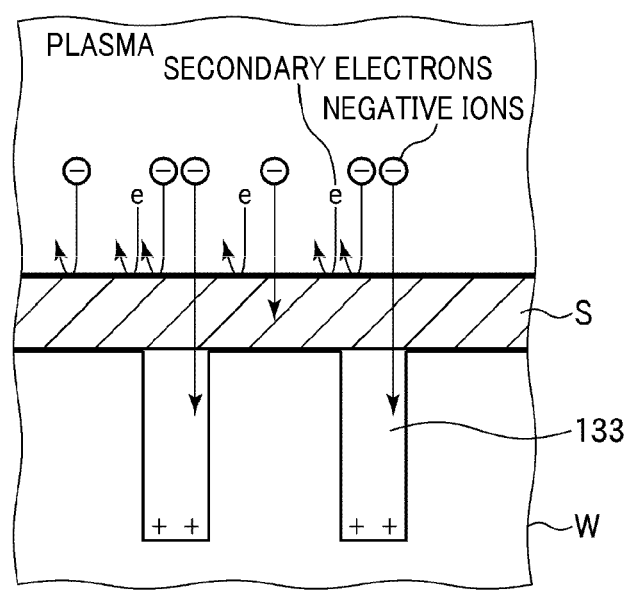
FIG. 19 is a schematic diagram illustrating a state when a high frequency bias is applied in a plasma-on state.
Figure 20:
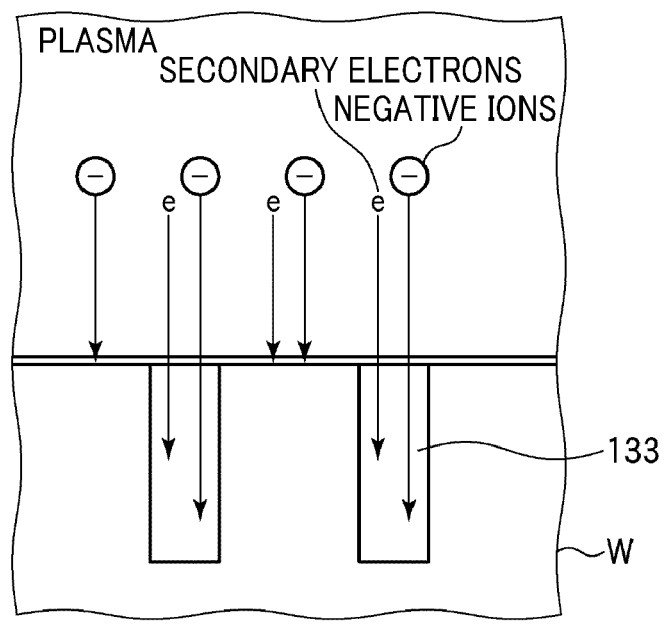
FIG. 20 is a schematic diagram illustrating a state when a high frequency bias power is turned off in a plasma-off state.

In this second process, it may be desirable to turn on and off the second high frequency power supply 90 for bias application in synchronization with the on/off operations of the first high frequency power supply 48, as shown in FIG. 18. If the second high frequency power supply 90 outputs a first output while the plasma is not generated by turning off the first high frequency power supply 48, a considerably thick plasma sheath exists on the susceptor 16 serving as the lower electrode, as shown in FIG. 19. Since such a thick plasma sheath functions as a barrier, the amount of the electrons and the negative ions reaching the contact hole 133 decreases. For the reason, when the plasma is not exist by the turn-off of the first high frequency power supply 48, the second high frequency power supply 90 is also turned off. Accordingly, the plasma sheath that would be a barrier to the flow of the electrons and the negative ions completely disappears, as shown in FIG. 20. As a result, the electrons and the negative ions can be supplied into the contact hole 133 sufficiently.

Third Embodiment

A third embodiment is described for an example case of performing HARC etching by using the plasma etching apparatus shown in FIG. 1. For example, as in the second embodiment, HARC etching is performed on an insulating film 131 of a semiconductor wafer W having a structure shown in FIG. 11.

Here, a first process of etching is performed in the same manner as in the second embodiment. Subsequently, a second process of etching is the same as the second process of the etching of the second embodiment excepting that a DC voltage is not applied from the second DC power supply 52 during a plasma-off period.

Figure 21:
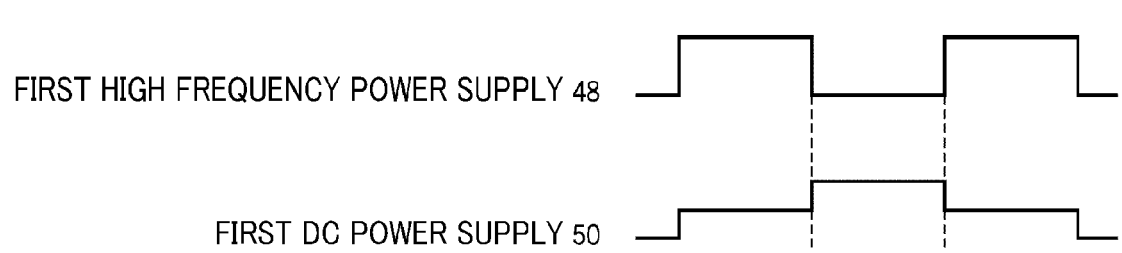
FIG. 21 is a timing chart illustrating an operational status of a first high frequency power supply and a first DC power supply in a second process of a plasma etching method in accordance with a third embodiment of the present disclosure.

That is, as shown in FIG. 21, a plasma-on state in which plasma (glow plasma) is generated by the first high frequency power supply 48 and a plasma-off state in which glow plasma is not generated are alternately repeated. In synchronization with the on and off of the plasma, the first DC power supply 50 applies a negative DC voltage to the upper electrode 34 during both the plasma-on period and the plasma-off period such that an absolute value of the applied negative DC voltage during the plasma-off period is greater than that of the applied negative DC voltage during the plasma-on period.

Accordingly, a typical etching process progresses during the plasma-on period. In the plasma-off period, on the other hand, a plasma sheath on the susceptor 16 is not exist because the first high frequency power supply 48 is turned off during a period of plasma (after-glow plasma) maintained for about several tens of μsec after the first high frequency power supply 48 is turned off. Accordingly, a greater amount of secondary electrons are generated by the negative DC voltage having a great absolute value applied from the first DC power supply 50 to the upper electrode 34, and the generated secondary electrons are highly accelerated. Therefore, the secondary electrons are introduced into the contact hole 133 without repulsion by the plasma sheath. Likewise, negative ions, which are generated as the glow plasma is turned off, are also highly accelerated by the negative DC voltage having a great absolute value and, thus, negative ions are introduced into the contact hole 133 without repulsion by the plasma sheath. Accordingly, since a great amount of secondary electrons and negative ions can be supplied into the contact hole 133 during the plasma-off period, positive charges in the contact hole can be neutralized.

As discussed above, as in the second embodiment, a regime in which the positive ions are mainly included due to the generation of the plasma (glow plasma) as a result of turning on the first high frequency power supply 48; and a regime in which the electrons and the negative ions are mainly included by turning off the first high frequency power supply 48 are alternately repeated in the third embodiment. During the regime in which the electrons and the negative ions are dominant, the electrons and the negative ions are implanted into the contact hole 133 to thereby neutralize the positive charges in the contact hole. Since the amount of the positive charges within the contact hole 133 is reduced, the positive ions can travel straight within the contact hole 133 when the first high frequency power supply 48 is turned on subsequently. As a result, a desirable etching shape can be achieved, and an etching rate can be increased. Furthermore, since the positive ions are not accumulated in the bottom of the contact hole 133, shading damage may not be caused readily. In the third embodiment, however, since the second DC power supply 52 is not provided, an effect of implanting the electrons and the negative ions into the contact hole 133 is not achieved. Thus, the effect of the second embodiment may be more advantageous than that of the third embodiment. That is, as compared to the second embodiment that is suitable for a next-generation HARC etching for forming a contact hole having an aspect ratio greater than about 40, the third embodiment is suitable for HARC etching having an aspect ratio of about 20.

Desirably, as in the above-described embodiments, the plasma-off period may be equal to or less than about 50 μsec in the third embodiment. If it exceeds 50 μsec, a time period that does not contribute to the etching is lengthened, resulting in deterioration of efficiency.

Moreover, as illustrated in FIG. 8 of the first embodiment, the DC voltage from the first DC power supply 50 may be turned off during the plasma-on period, while it is turned on during the plasma-off period. Further, the absolute value of the DC voltage from the first DC power supply 50 needs to be limited within a range that does not contribute to the plasma generation.

Figure 22:
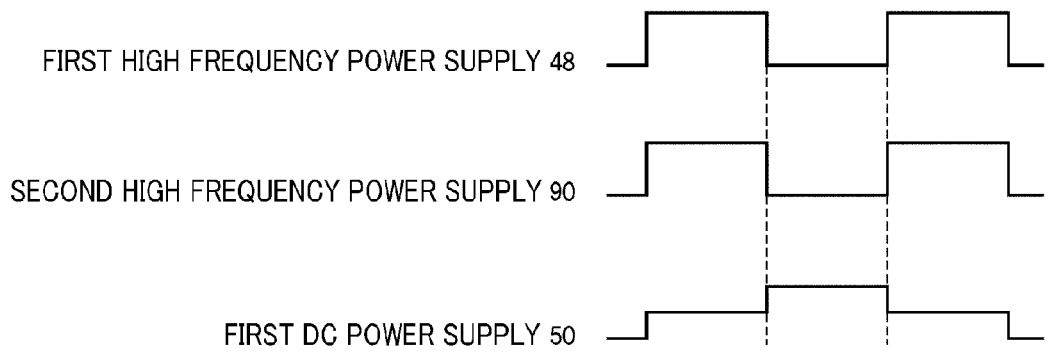
FIG. 22 is a timing chart illustrating an example of turning on and off a second high frequency power for bias application in synchronization with an on/off operation of the first high frequency power supply for plasma generation in the second process of the plasma etching method in accordance with the third embodiment of the present disclosure.

In the second process of the third embodiment, it may be desirable to turn on and off the second high frequency power supply 90 for bias application in synchronization with the on/off operations of the first high frequency power supply 48, as shown in FIG. 22. If the second high frequency power supply 90 outputs a first output while the plasma is not generated by turning off the first high frequency power supply 48, a considerably thick plasma sheath exists on the susceptor 16 serving as the lower electrode, as shown in FIG. 19. Since such a thick plasma sheath functions as a barrier, the amount of the electrons and the negative ions reaching the contact hole 133 decreases. For the reason, when the plasma is not exist by the turn-off of the first high frequency power supply 48, the second high frequency power supply 90 is also turned off. Accordingly, the plasma sheath that would be a barrier to the flow of the electrons and the negative ions completely disappears, as shown in FIG. 20. As a result, the electrons and the negative ions can be supplied into the contact hole 133 sufficiently.

A sequence shown in FIG. 22 is the same as that shown in FIG. 5 of the first embodiment. By using such a sequence, it is possible to achieve an effect of neutralizing the positive charges in the contact hole 133; an effect of preventing shading damage; and an effect of modifying and reinforcing an organic film such as a photoresist film by means of secondary electrons as described earlier in the first embodiment.

(Another Example Plasma Etching Apparatus Capable of Performing Plasma Etching Method of Present Disclosure)

Figure 23:
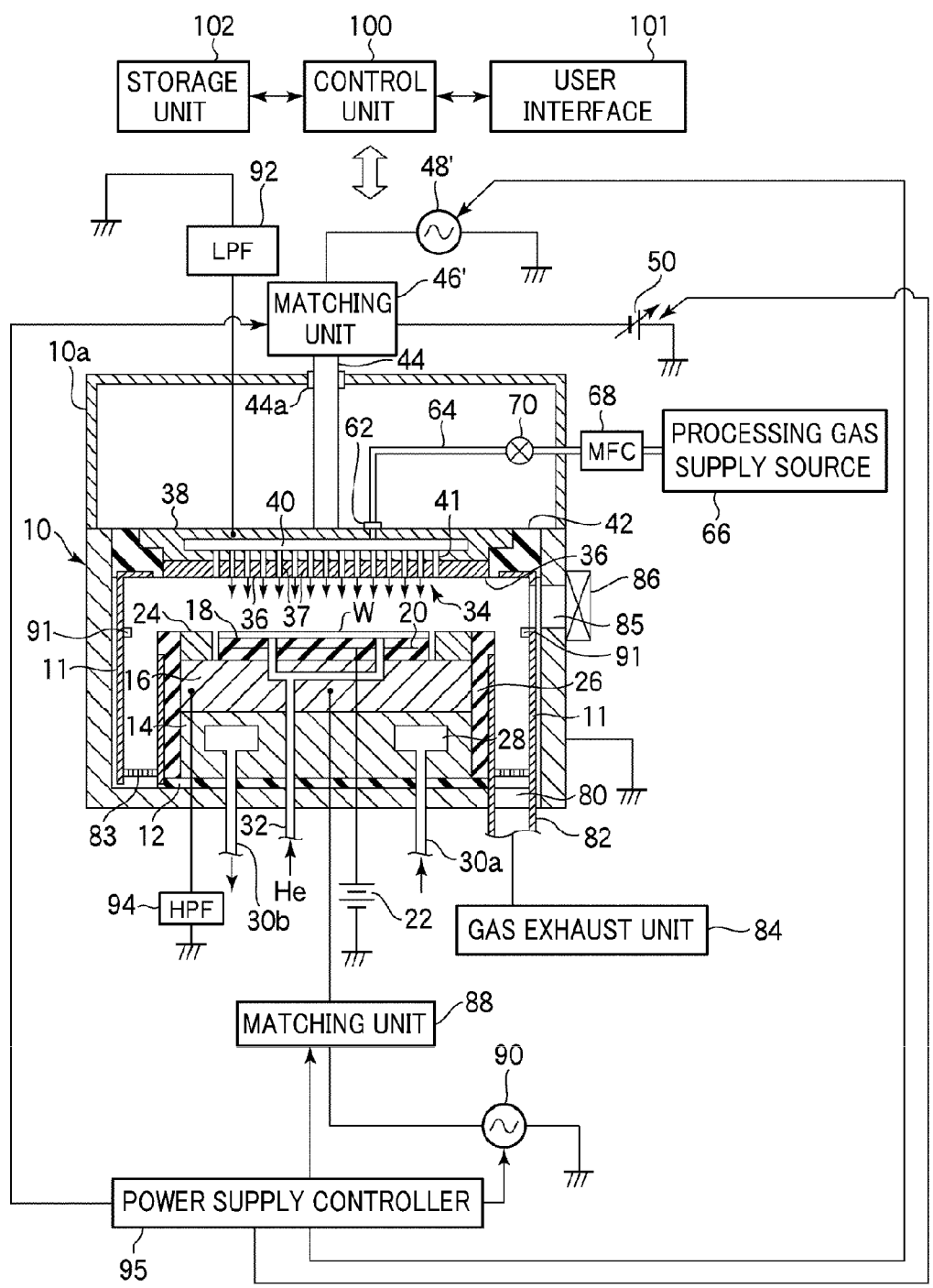
FIG. 23 is a schematic cross sectional view illustrating another plasma etching apparatus capable of performing a plasma etching method in accordance with the present disclosure.

Now, another example plasma etching apparatus capable of performing a plasma etching method of the present disclosure will be described. FIG. 23 is a schematic cross sectional view illustrating another plasma etching apparatus capable of performing the plasma etching method of the present disclosure. Specifically, this plasma etching apparatus is capable of performing the first and the third embodiment.

This plasma etching apparatus is different from the apparatus illustrated in FIG. 1 in that the former is configured to apply a high frequency power for plasma generation to an upper electrode, but the other parts of this plasma etching apparatus are the same as those of the plasma etching apparatus described in the first embodiment. Therefore, same parts in FIG. 23 as those in FIG. 1 will be assigned same reference numerals and redundant description thereof will be omitted.

In the apparatus of FIG. 23, a first high frequency power supply 48' for plasma generation is connected with an upper electrode 34 via a first matching unit 46' and a power feed rod 44. The first high frequency power supply 48' has the same function as the first high frequency power supply 48 in the first embodiment. A frequency of the first high frequency power supply 48' is desirable to be in the range from about 27 to about 100 MHz. The first matching unit 46' matches a load impedance with an internal (or output) impedance of the first high frequency power supply 48'. When plasma is generated within a chamber 10, the first matching unit 46' makes the output impedance of the first high frequency power supply 48' and the load impedance apparently matched with each other. An output terminal of the first matching unit 46' is connected with an upper end of the power feed rod 44. Further, a variable DC power supply 50 is connected with the upper electrode 34 via the first matching unit 46' and the power feed rod 44.

Figure 24:
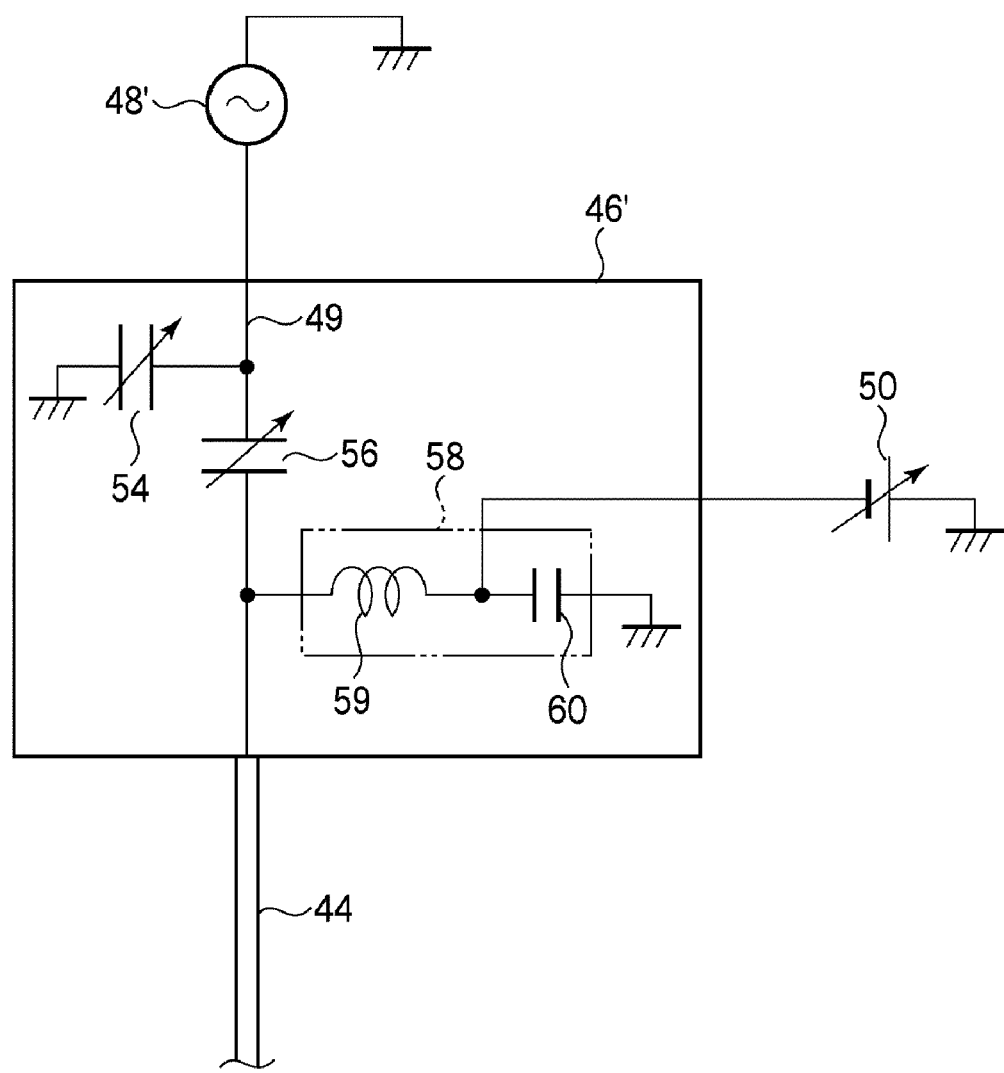
FIG. 24 is a view showing a configuration of a first matching unit connected with a first high frequency power supply in the plasma etching apparatus of FIG. 23.

As depicted in FIG. 24, the first matching unit 46' includes a first variable capacitor 54 branched from a branch point on a power feed line 49 of the first high frequency power supply 48', a second variable capacitor 56 provided at a downstream side of the branch point of the power feed line 49. With these components, the first matching unit 46' exhibits the above-described function. Further, the first matching unit 46' includes therein a filter 58 that traps a high frequency power (e.g., about 40 MHz) from the first high frequency power 48' and a high frequency power (e.g., about 3 MHz) from a second high frequency power supply 90 such that a DC voltage current (hereinafter, simply referred to as "DC voltage") can be efficiently applied to the upper electrode 34. That is, a DC current from the DC voltage application unit 50 flows through the filter 58 to the power feed line 49. The filter 58 includes a coil 59 and a capacitor 60 which trap a high frequency power from the first high frequency power supply 48' and a high frequency power from the second high frequency power supply 90. Furthermore, there is installed a cylindrical insulating member 44a between a ceiling wall portion of a cylindrical ground conductor 10a and the power feed rod 44. The power feed rod 44 and the ground conductor 10a are electrically insulated by this insulating member 44a.

The upper electrode 34 is electrically connected with a low pass filter (LPF) 92 which does not allow the high frequency power (e.g., about 40 MHz) from the first high frequency power supply 48' to pass therethrough but allows the high frequency power (e.g., about 3 MHz) from the second high frequency power supply 90 to pass through to the ground. The low pass filter (LPF) 92 may include an LR filter or an LC filter. Since it is possible to provide sufficient reactance to the high frequency power (about 60 MHz) from the first high frequency power supply 48' through only one conducting wire, no further installation is necessary. Meanwhile, a susceptor 16 serving as a lower electrode is electrically connected with a high pass filter (HPF) 94 that allows the high frequency power (e.g., about 40 MHz) from the first high frequency power supply 48' to pass through to the ground.

In the plasma etching apparatus shown in FIG. 23, plasma is turned on and off by turning on and off the first high frequency power supply 48' for plasma generation and desirably, the second high frequency power supply is also turned on and off in synchronization with an on and off operation of the first high frequency power supply 48'. A high frequency voltage is applied from the first DC power supply 50 such that an absolute value of the applied high frequency voltage during a plasma-off period is greater than an absolute value thereof during a plasma-on period. Accordingly, effects of the first and second embodiments are achieved.

In the apparatus of FIG. 23, the first high frequency power for plasma generation is supplied to the upper electrode 34 and the second high frequency power for ion implantation is supplied to the susceptor 16 serving as a lower electrode, and, thus, a plasma control margin can be set broader. Further, since the high frequency power having a high frequency of about 27 MHz or higher is supplied to the upper electrode 34, it is possible to increase density of plasma in a desired state, and, thus, even under the lower pressure condition, it is possible to generate high-density plasma.

Figure 25:
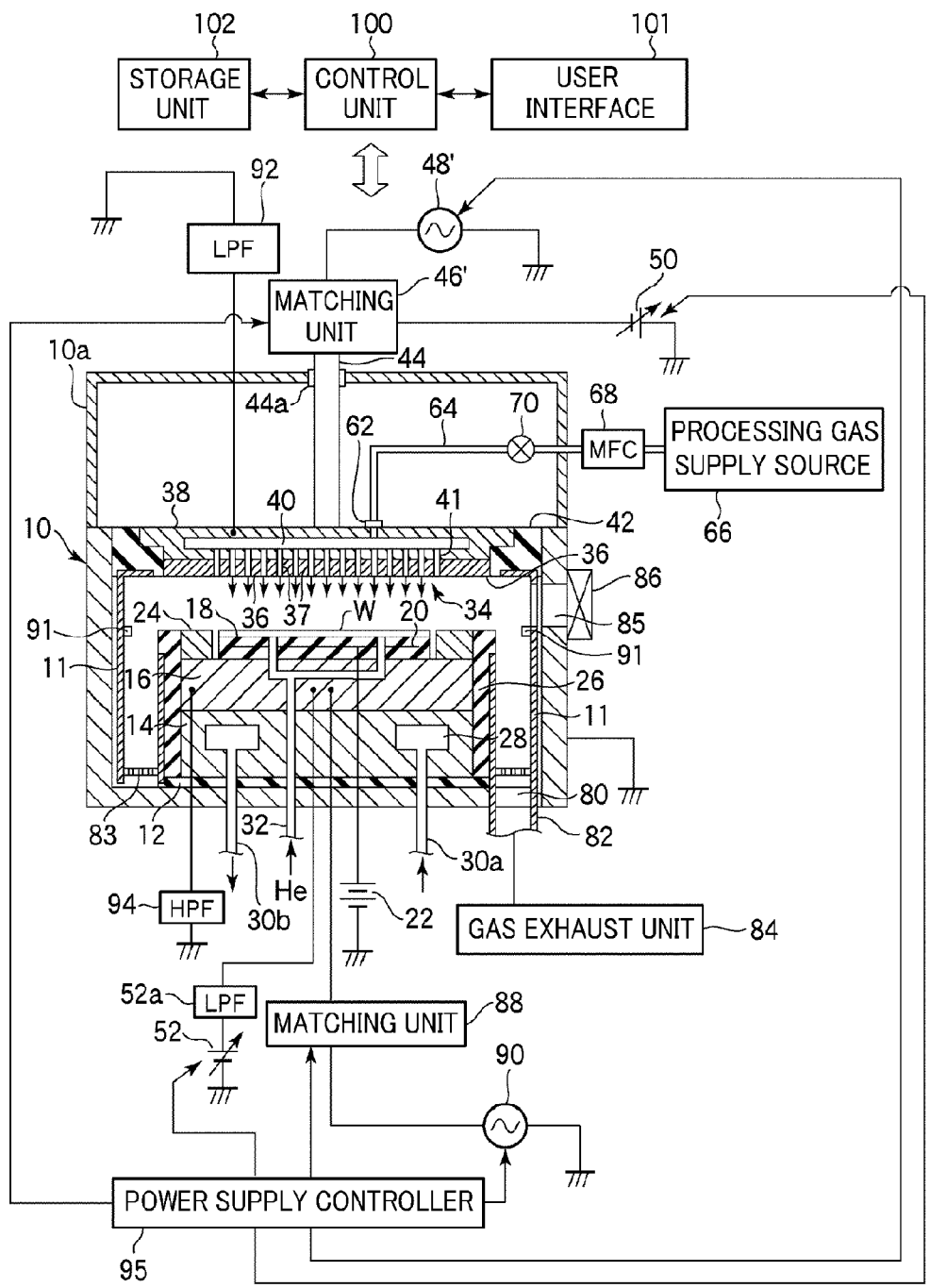
FIG. 25 is a schematic cross sectional view illustrating still another plasma etching apparatus capable of performing a plasma etching method in accordance with the present disclosure.

Now, still another plasma etching apparatus capable of performing a plasma etching method of the present disclosure will be explained. FIG. 25 is a schematic cross sectional view illustrating still another plasma etching apparatus capable of performing the plasma etching method of the present disclosure. Specifically, this plasma etching apparatus is capable of performing the second embodiment.

This plasma etching apparatus has the same configuration as that of the apparatus of FIG. 23 excepting that an anode of a second DC power supply 52 is connected to the side of a susceptor 16 serving as a lower electrode via a low pass filter (LPF) 52a so as to apply a positive (plus) voltage to the susceptor 16 and the second DC power supply 52 is controlled by a power supply controller 95.

Like the plasma etching apparatus of FIG. 10, the plasma etching apparatus of FIG. 25 turns on and off plasma by way of turning on and off a first high frequency power supply 48' for plasma generation. A negative DC power is applied to an upper electrode 34 from a first DC power supply 50 during both a plasma-on and a plasma-off period, and a positive DC voltage is applied to the susceptor 16 serving as the lower electrode from the second DC power supply 52 during the plasma-off period. In this manner, negatively charged particles can be certainly supplied into a contact hole during the plasma-off period, and, thus, the effect of the second embodiment can be achieved effectively.

Further, as in the apparatus of FIG. 23, the first high frequency power for plasma generation is supplied to the upper electrode 34 and the second high frequency power for ion implantation is supplied to the susceptor 16 serving as a lower electrode in the apparatus of FIG. 25, and, thus, a plasma control margin can be set broader. Further, since the high frequency power having a high frequency of about 27 MHz or higher is supplied to the upper electrode 34, it is possible to increase density of plasma in a desired state, and, thus, even under the lower pressure condition, it is possible to generate high-density plasma.

In the above-described embodiments, a frequency of the first high frequency power may be, but not limited to, about 27 MHz, about 40 MHz, about 60 MHz, about 80 MHz, or about 100 MHz, and a frequency of the second high frequency power may be, but not limited to, about 400 kHz, about 800 kHz, about 1 MHz, about 2 MHz, about 3 MHz, about 13 MHz, or about 13.6 MHz. Suitable combination thereof can be selected depending on the process.

OTHER APPLICATIONS OF PRESENT INVENTION

While the present invention has been described with respect to the embodiments, it should be noted that the present invention is not limited thereto but can be modified in various ways. For example, the apparatus for performing the method of the present invention is not limited to the above-described examples, but it may have a configuration in which a single high frequency power supply for plasma generation is coupled to the lower electrode, for example. Further, in the second and third embodiments, although the plasma etching involves the first process of continuously applying the high frequency power for plasma generation and the second process of turning on and off the high frequency power for plasma generation while applying the DC voltage to the upper electrode 34, only the second process may be performed. Moreover, although the first DC voltage is applied during the plasma etching in the above-described embodiments, application of the first DC voltage is not essential. Further, a processing target object to which the present disclosure is applied is not limited to the example shown in FIG. 3 or 11. For example, the processing target object may have an anti-reflection film between a photoresist and an etching target film. Although the etching target film is typically an insulating film such as an oxide film, but it is not limited thereto.

What is claimed is:

1. A plasma etching method for forming a hole in an etching target film by using a plasma etching apparatus including an evacuable processing chamber configured to accommodate a processing target object therein; a lower electrode provided within the processing chamber and serving as a mounting table for the processing target object; an upper electrode provided within the processing chamber and facing the lower electrode; a processing gas supply unit configured to supply a processing gas into the processing chamber; a plasma generation power unit configured to apply a plasma generation power to at least one of the upper electrode and the lower electrode; and a first DC power supply configured to apply a negative DC voltage to the upper electrode, the method comprising:

turning on the plasma generation power unit while applying a first negative DC voltage from the first DC power supply; and turning off the plasma generation power unit while applying a second negative DC voltage from the first DC power supply, wherein an absolute value of the second negative DC voltage is greater than an absolute value of the first negative DC voltage.

2. The plasma etching method of claim 1, wherein the plasma etching apparatus further includes a bias power supply unit configured to apply a bias power to the lower electrode, and the bias power supply unit is turned on and off in synchronization with an on/off operation of the plasma generation power unit.

3. The plasma etching method of claim 1, wherein the negative DC voltage is applied from the first DC power supply during both the period of turning on the plasma generation power unit and the period of turning off the plasma generation power unit.

4. The plasma etching method of claim 1, wherein the negative DC voltage from the first DC power supply is not applied during the period of turning on the plasma generation power unit and the negative DC voltage from the first DC power supply is applied during the period of turning off the plasma generation power unit.

5. The plasma etching method of claim 1, wherein repetition of turning on the plasma generation power unit and turning off the plasma generation power unit is carried out by applying the plasma generation power from the plasma generation power unit in a pulse pattern.

6. The plasma etching method of claim 1, wherein the etching target film of the processing target object is an insulating film.

7. A plasma etching method for forming a hole in an etching target film by using a plasma etching apparatus including an evacuable processing chamber configured to accommodate a processing target object therein; a lower electrode provided within the processing chamber and serving as a mounting table for the processing target object; an upper electrode provided within the processing chamber and facing the lower electrode; a processing gas supply unit configured to supply a processing gas into the processing chamber; a plasma generation power unit configured to apply a plasma generation power to at least one of the upper electrode and the lower electrode; and a first DC power supply configured to apply a negative DC voltage to the upper electrode, the method comprising:
a first process and a second process,
wherein the first process comprises:
generating plasma within the processing chamber by way of continuously supplying the plasma generation power from the plasma generation power unit; and
applying a negative DC voltage to the upper electrode from the first DC power supply when necessary,
wherein the second process comprises:
turning on the plasma generation power unit while applying a first negative DC voltage from the first DC power supply; and
turning off the plasma generation power unit while applying a second negative DC voltage from the first DC power supply,
wherein an absolute value of the second negative DC voltage is greater than an absolute value of the first negative DC voltage.

8. The plasma etching method of claim 7, wherein the plasma etching apparatus further includes a bias power supply unit configured to apply a bias power to the lower electrode,
in the first process, a bias bower is continuously applied from the bias power supply unit, and
in the second process, the bias power supply unit is turned on and off in synchronization with an on/off operation of the plasma generation power unit.

9. A plasma etching method for forming a hole in an etching target film by using a plasma etching apparatus including an evacuable processing chamber configured to accommodate a processing target object therein; a lower electrode provided within the processing chamber and serving as a mounting table for the processing target object; an upper electrode provided within the processing chamber and facing the lower electrode; a processing gas supply unit configured to supply a processing gas into the processing chamber; a plasma generation power unit configured to apply a plasma generation power to at least one of the upper electrode and the lower electrode; and a first DC power supply configured to apply a negative DC voltage to the upper electrode; and a second DC power supply configured to apply a positive DC voltage to the lower electrode, the method comprising:
a first operation of turning on the plasma generation power unit;
a second operation of turning off the plasma generation power unit;
at least during the second operation, applying a negative DC voltage to the upper electrode from the first DC power supply; and
only during the second operation, applying a positive DC voltage to the lower electrode from the second DC power supply.

10. The plasma etching method of claim 9, wherein the plasma etching apparatus further includes a bias power supply unit configured to apply a bias power to the lower electrode, and
the bias power supply unit is turned on and off in synchronization with an on/off operation of the plasma generation power unit.

11. The plasma etching method of claim 9, wherein the negative DC voltage is applied to the upper electrode from the first DC power supply during both the period of turning on the plasma generation power unit and the period of turning off the plasma generation power unit.

12. The plasma etching method of claim 9, wherein the positive DC voltage is applied to the lower electrode only one time in a pulse pattern during the period of turning off the plasma generation power unit.

13. The plasma etching method of claim 12, wherein the positive DC voltage is applied in a pulse pattern in about 10 μsec to about 30 μsec after beginning of turning off the plasma generation power unit.

14. The plasma etching method of claim 9, wherein an absolute value of the negative DC voltage applied to the upper electrode during the period of turning off the plasma generation power unit is set to be greater than an absolute value of the negative DC voltage applied during the period of turning on the plasma generation power unit.

15. A plasma etching method for forming a hole in an etching target film by using a plasma etching apparatus including an evacuable processing chamber configured to accommodate a processing target object therein; a lower electrode provided within the processing chamber and serving as a mounting table for the processing target object; an upper electrode provided within the processing chamber and facing the lower electrode; a processing gas supply unit configured to supply a processing gas into the processing chamber; a plasma generation power unit configured to apply a plasma generation power to at least one of the upper electrode and the lower electrode; and a first DC power supply configured to apply a negative DC voltage to the upper electrode; and a second DC power supply configured to apply a positive DC voltage to the lower electrode, the method comprising:

a first process and a second process, wherein the first process comprises:

generating plasma within the processing chamber by way of continuously supplying the plasma generation power from the plasma generation power unit; and applying a negative DC voltage to the upper electrode from the first DC power supply when necessary, wherein the second process comprises:

a first operation of turning on the plasma generation power unit;

a second operation of turning off the plasma generation power unit;

at least during the second operation, applying a negative DC voltage to the upper electrode from the first DC power supply; and only during the second operation, applying a positive DC voltage to the lower electrode from the second DC power supply.

16. The plasma etching method of claim 15, wherein the plasma etching apparatus further includes a bias power supply unit configured to apply a bias power to the lower electrode, in the first process, a bias power is continuously applied from the bias power supply unit, and in the second process, the bias power supply unit is turned on and off in synchronization with an on/off operation of the plasma generation power unit.

* * * * *